(12) United States Patent
Lo et al.

(10) Patent No.: US 12,482,703 B2
(45) Date of Patent: Nov. 25, 2025

(54) SEMICONDUCTOR DEVICE HAVING THERMALLY CONDUCTIVE AIR GAP STRUCTURE AND METHOD FOR MANUFACTURING THE SAME

(71) Applicant: TAIWAN SEMICONDUCTOR MANUFACTURING COMPANY, LTD., Hsinchu (TW)

(72) Inventors: Ting-Ya Lo, Hsinchu (TW);
Shao-Kuan Lee, Hsinchu (TW);
Chi-Lin Teng, Hsinchu (TW);
Cherng-Shiaw Tsai, Hsinchu (TW);
Cheng-Chin Lee, Hsinchu (TW);
Kuang-Wei Yang, Hsinchu (TW);
Hsin-Yen Huang, Hsinchu (TW);
Hsiao-Kang Chang, Hsinchu (TW);
Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 664 days.

(21) Appl. No.: 17/461,542

(22) Filed: Aug. 30, 2021

(65) Prior Publication Data
US 2023/0065583 A1 Mar. 2, 2023

(51) Int. Cl.
*H01L 21/768* (2006.01)

(52) U.S. Cl.
CPC .. *H01L 21/76831* (2013.01); *H01L 21/76802* (2013.01); *H01L 21/76877* (2013.01)

(58) Field of Classification Search
CPC ......... H01L 21/76831; H01L 21/76802; H01L 21/76877; H01L 21/76807; H01L 21/7682; H01L 21/76832; H01L 21/76834; H01L 21/76897; H01L 23/5222; H01L 23/53295; H01L 21/76885; H01L 21/76829
USPC .......... 257/77; 438/624, 653, 627, 643, 619, 438/740, 761
See application file for complete search history.

(56) References Cited

U.S. PATENT DOCUMENTS

| 2003/0064588 | A1* | 4/2003 | Catabay | H01L 21/76846 |
| | | | | 438/653 |
| 2014/0167267 | A1* | 6/2014 | Uzoh | H01L 23/49838 |
| | | | | 257/773 |
| 2015/0380352 | A1* | 12/2015 | Sung | H01L 23/528 |
| | | | | 257/774 |

(Continued)

*Primary Examiner* — Eva Y Montalvo
*Assistant Examiner* — Nicholas B Michaud
(74) *Attorney, Agent, or Firm* — Birch, Stewart, Kolasch & Birch, LLP

(57) ABSTRACT

A method for manufacturing a semiconductor device includes preparing an electrically conductive structure including a plurality of electrically conductive features, conformally forming a thermally conductive dielectric capping layer on the electrically conductive structure, conformally forming a dielectric coating layer on the thermally conductive dielectric capping layer, filling a sacrificial material into recesses among the electrically conductive features, recessing the sacrificial material to form sacrificial features in the recesses, forming a sustaining layer over the dielectric coating layer to cover the sacrificial features, and removing the sacrificial features to form air gaps covered by the sustaining layer. The thermally conductive dielectric capping layer has a thermal conductivity higher than that of the dielectric coating layer.

20 Claims, 28 Drawing Sheets

(56) References Cited

U.S. PATENT DOCUMENTS

| | | | | |
|---|---|---|---|---|
| 2018/0047615 A1* | 2/2018 | Cheng | ............... | H01L 27/1211 |
| 2018/0130697 A1* | 5/2018 | Jang | ................... | H01L 23/528 |
| 2020/0350891 A1* | 11/2020 | Turner | .................. | H03H 3/02 |
| 2021/0193566 A1* | 6/2021 | Lo | ..................... | H01L 21/7682 |

* cited by examiner

SEMICONDUCTOR DEVICE HAVING THERMALLY CONDUCTIVE AIR GAP STRUCTURE AND METHOD FOR MANUFACTURING THE SAME

BACKGROUND

The integration density of various electronic components, such as transistors, diodes, resistors, capacitors, etc., is being improved continuously in the semiconductor industry by continual reduction in minimum feature sizes. As the feature sizes are decreased, the distance between metal features is continually reduced. As the distance between the metal features reduces, the resulting parasitic capacitance between the metal features increases, leading to higher power consumption and larger resistance-capacitance (RC) time delays for an integrated chip. To improve performance and reduce the parasitic capacitance between the metal features, materials having low dielectric (k) values are used. However, such dielectric materials encounter a lot of processing problems that prevent further improvement of the dielectric constant.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
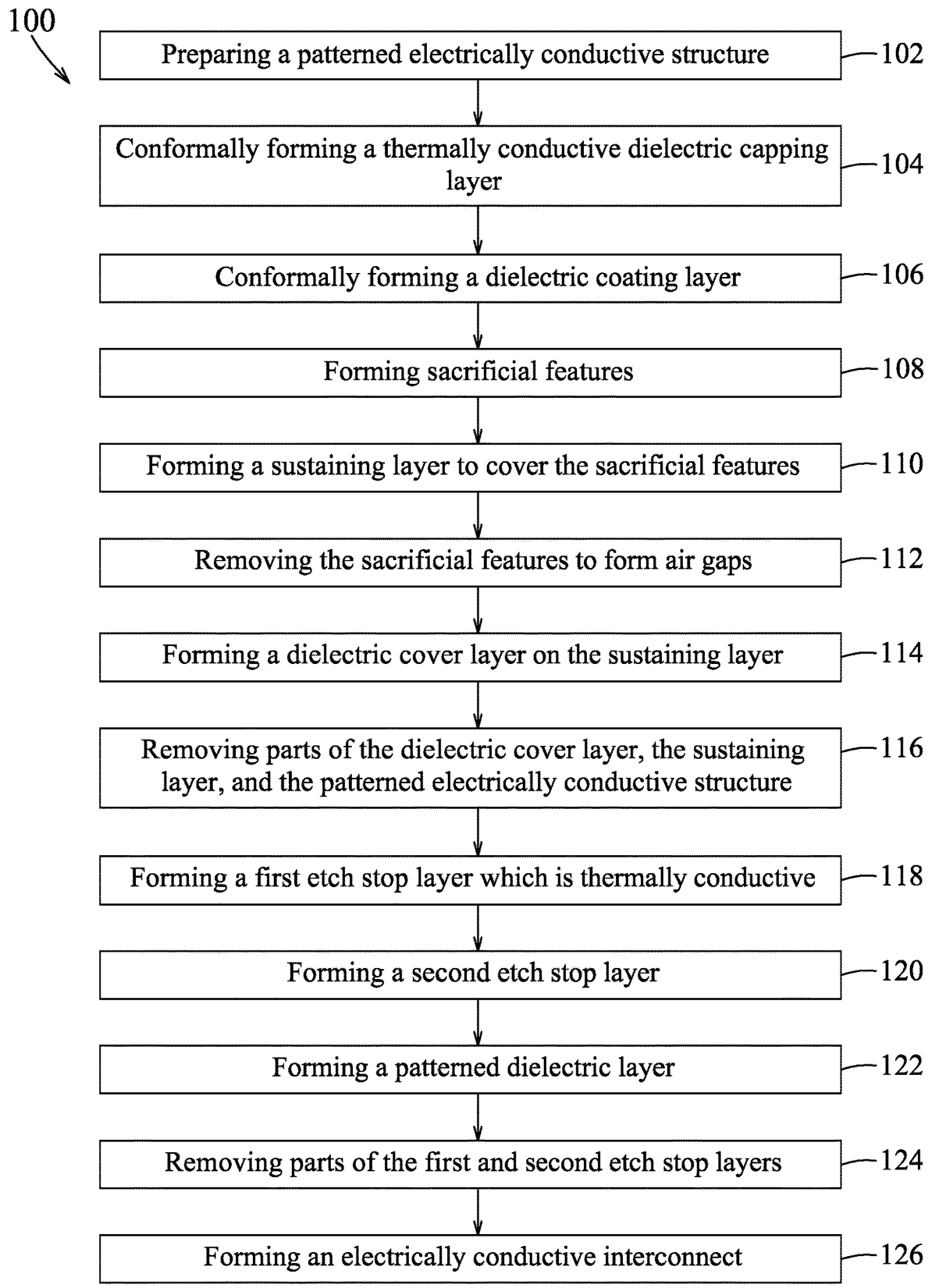
FIG. 1 is a flow diagram illustrating a method for manufacturing a semiconductor device having air gaps in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "on," "above," "over," "downwardly" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The design of an air gap structure in semiconductor devices to enhance the isolation of the metal features is known in the art of semiconductor fabrication. Since air has a lowest k value (k=1), a growing trend has been to incorporate air gaps into the semiconductor devices to isolate the metal features and reduce line-to-line capacitance and the RC time delay. However, vacancy areas formed by the air gap structure may give poor thermal conductivity. Improved methods for enhancing the thermal conductivity of the semiconductor devices having the air gap structure are desired.

Meanwhile, if via landing is deviated due to overlay shift, worse degradation of via to line breakdown/leakage and time dependent dielectric breakdown (TDDB) is likely to be observed.

FIG. 1 illustrates a method 100 for manufacturing a semiconductor device in accordance with some embodiments. FIGS. 2 to 17 illustrate schematic views of a semiconductor device 200 during various stages of the method 100 of FIG. 1. The method 100 and the semiconductor device 200 are collectively described below. However, additional steps can be provided before, after or during the method 100, and some of the steps described herein may be replaced by other steps or be eliminated. Similarly, further additional features may be present in the semiconductor device 200, and/or features present may be replaced or eliminated in additional embodiments.

Referring to FIG. 1, the method 100 begins at block 102, where an electrically conductive structure is prepared. Referring to the example illustrated in FIGS. 2 to 5, an electrically conductive structure 30 is prepared on a first interconnect layer 20 disposed over a substrate 10.

Figure 2:
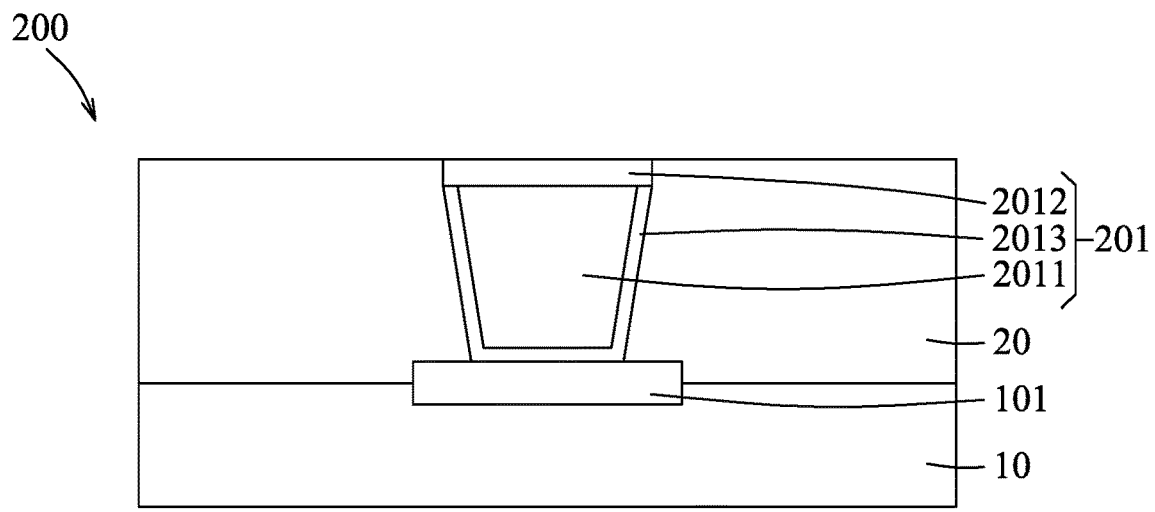
FIGS. 2 to 17 illustrate schematic views showing intermediate stages of the method for manufacturing a semiconductor device having air gaps as depicted in FIG. 1.

Referring specifically to the example illustrated in FIG. 2, the first interconnect layer 20 formed with at least one electrically conductive interconnect 201 (for example, an electrically conductive via contact) is prepared on the substrate 10. Specifically, a dielectric layer formed with an opening is prepared on the substrate 10. The dielectric layer may be made of a dielectric material, such as silicon oxide, SiOC-based materials (e.g., SiOCH), borophosphosilicate glass (BPSG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers. In some embodiments, silicon oxide may be formed from tetraethyl orthosilicate (TEOS). The dielectric layer may be formed on the substrate 10 by a suitable deposition process as is known to those skilled in the art of semiconductor fabrication, for example, atomic layer deposition (ALD), chemical vapor deposition (CVD), physical vapor deposition (PVD), etc., or combinations thereof, but not limited thereto. A first electrically conductive material is filled into the opening and is then subjected to a planarization treatment (for example, chemical mechanical planarization (CMP)) to form a recessed electrically conductive element 2011 in the opening. A metal capping layer 2012 is deposited on the recessed electrically conductive element 2011 to form the at least one electrically conductive interconnect 201 having a top surface horizontally flush with that of the dielectric layer. The first interconnect layer 20 formed with the at least one electrically conductive interconnect 201 is thus prepared on the substrate 10. The at least one electrically conductive interconnect 201 includes the recessed electrically conductive element 2011 and the metal capping layer 2012. The recessed electrically conductive element 2011 may have a thickness ranging from 50 Å to 500 Å. The metal capping layer 2012 may have a thickness ranging from 2 Å to 50 Å.

The first electrically conductive material for forming the recessed electrically conductive element 2011 may be, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), gold (Au), aluminum (Al), or alloys thereof. The first electrically conductive material may be provided as multiple layers having varying composition, and may be filled into the opening by a suitable process as is known in the art of semiconductor fabrication, such as electroless plating, electroplating, sputter deposition, PVD, CVD, ALD, etc., or combinations thereof, but not limited thereto.

While the first electrically conductive material may be a suitable metal or alloy thereof as described above, the method of the present disclosure are particularly adapted to the use of copper. Electroless plating of copper generally includes forming a seed layer followed by autocatalytic copper deposition. Examples of the material for the seed layer include Cu, Ni, Au, Ag, Pd, Ir, nickel-palladium-gold (NiPdAu), and nickel-gold (NiAu), but not limited thereto. The seed layer can be formed by a suitable process as is known in the art of semiconductor fabrication, such as electroless deposition, sputtering, CVD, etc., or combinations thereof, but not limited thereto. Before filling copper or the like into the opening, the opening may be lined with a barrier layer 2013 that prevents electromigration. Examples of materials for the barrier layer 2013 include Ru, Mn, Co, Cr, titanium nitride (TiN), titanium tungsten (TiW), tantalum (Ta), tantalum nitride (TaN), tungsten nitride (WN), and combinations thereof. The barrier layer 2013 can be deposited by a suitable process, such as CVD.

The metal capping layer 2012 is made of an electrically conductive material which may be, for example, Cu, Co, Ru, Mo, Cr, W, Mn, Rh, Ir, Ni, Pd, Pt, Ag, Au, Al, or alloys thereof. It should be noted that the electrically conductive material for forming the metal capping layer 2012 should be different from the first electrically conductive material for forming the recessed electrically conductive element 2011, so as to provide a better interface adhesion between the recessed electrically conductive element 2011 and a metal layer subsequently formed on the metal capping layer 2012. The metal capping layer 2012 may be deposited on the recessed electrically conductive element 2011 by a suitable process as is known in the art of semiconductor fabrication, such as PVD, CVD, ALD, etc., or combinations thereof, but not limited thereto.

In some embodiments, the substrate 10 may be a semiconductor substrate, e.g., an elemental semiconductor or a compound semiconductor. An elemental semiconductor is composed of single species of atoms, such as silicon (Si) or germanium (Ge) in column IV of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition thereof changes from one ratio at one location to another ratio at another location in the compound semiconductor. The compound semiconductor may be formed over a silicon substrate. The compound semiconductor may be strained. In some embodiments, the substrate 10 may include a multilayer compound semiconductor device. Alternatively, the substrate 10 may include a non-semiconductor material, such as a glass, fused quartz, or calcium fluoride. Furthermore, in some embodiments, the substrate 10 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. The substrate may be doped with a p-type dopant, such as boron (Br), aluminum (Al), gallium (Ga), or the like, or may alternatively be doped with an n-type dopant, as is known in the art. In some embodiments, the substrate 10 may include a doped epitaxial layer. Shallow trench isolation (STI) regions (not shown) may be formed in the substrate 10 to isolate active regions (one is schematically shown in FIG. 2 with the numeral 101), such as source or drain regions of an integrated circuit device (not shown) in the substrate 10. In some embodiments, the integrated circuit device may include complementary metal-oxide semiconductor (CMOS) transistors, planar or vertical multi-gate transistors (e.g., FinFET devices), gate-all-around (GAA) devices, resistors, capacitors, diodes, transistors (e.g., field-effect transistors (FETs)), interconnections, or the like, based on practical applications. In addition, through-vias (not shown) may be formed to extend into the substrate 10 for electrically connecting features on opposite sides of the substrate 10.

Figure 3:
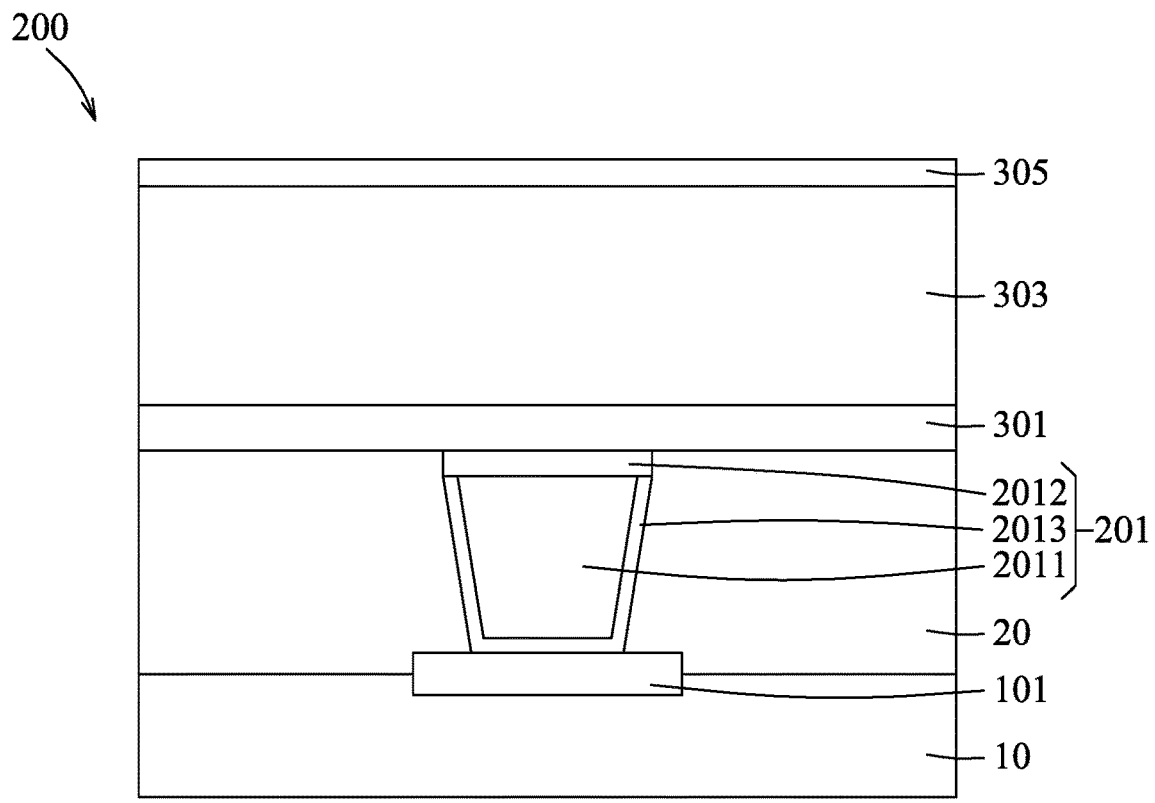

Referring specifically to the example illustrated in FIG. 3, a glue layer 301, a metal layer 303, and a mask layer 305 (for example, a hard mask layer) are deposited sequentially on the first interconnect layer 20. The glue layer 301 may be made of a nitride of Ta, titanium (Ti), or other suitable metals, and may be deposited on the first interconnect layer 20 by a suitable process as is known in the art of semiconductor fabrication, such as PVD, CVD, ALD, etc., or combinations thereof, but not limited thereto. The glue layer 301 can provide good adhesion to the first interconnect layer 20 and the metal layer 303, and may have a thickness ranging from 2 Å to 100 Å. The metal layer 303 is made of an electrically conductive material which may be, for example, Cu, Co, Ru, Mo, Cr, W, Mn, Rh, Ir, Ni, Pd, Pt, Ag, Au, Al, or alloys thereof, and may be deposited on the glue layer 301 by a suitable process as is known in the art of semiconductor fabrication, such as PVD, CVD, ALD, etc., or combinations thereof, but not limited thereto. The metal layer 303 may have a thickness ranging from 50 Å to 500 Å. Materials suitable for forming the mask layer 305 include, for example, silicon oxide, silicon nitride, silicon carbide, silicon oxycarbide, silicon oxynitride, silicon carbonitride, silicon oxycarbonitride, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof, but are not limited thereto. The mask layer 305 may be deposited on the metal layer 303 by a suitable process as is known in the art of semiconductor fabrication, such as PVD, CVD, ALD, etc., or combinations thereof, but not limited thereto.

Figure 4:
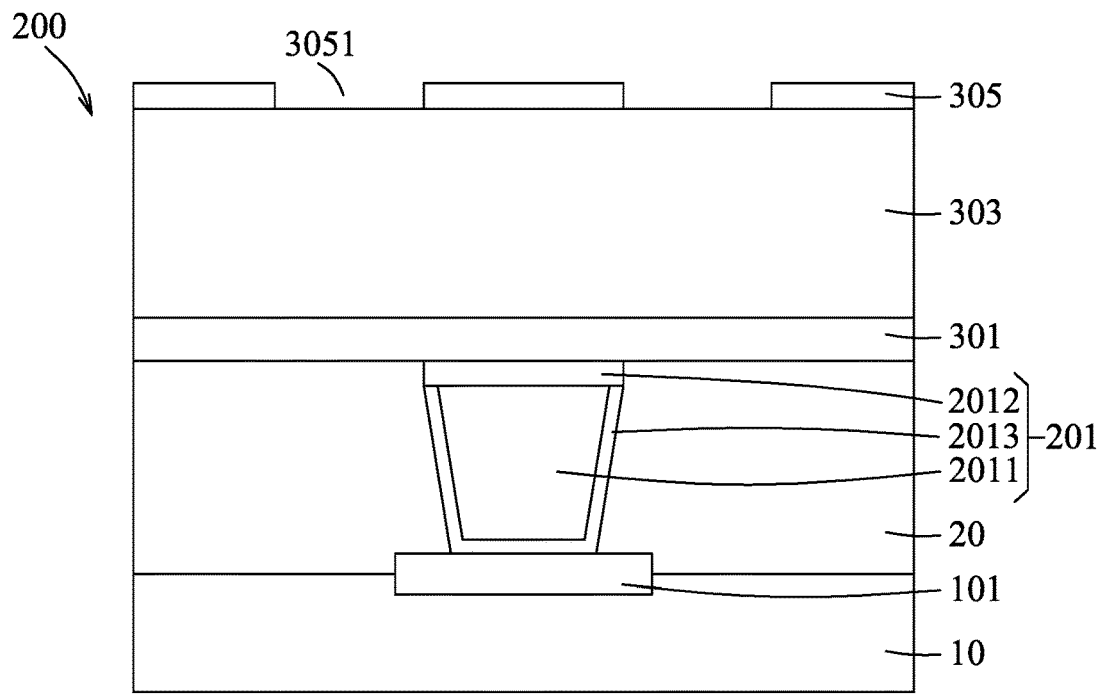
Figure 5:
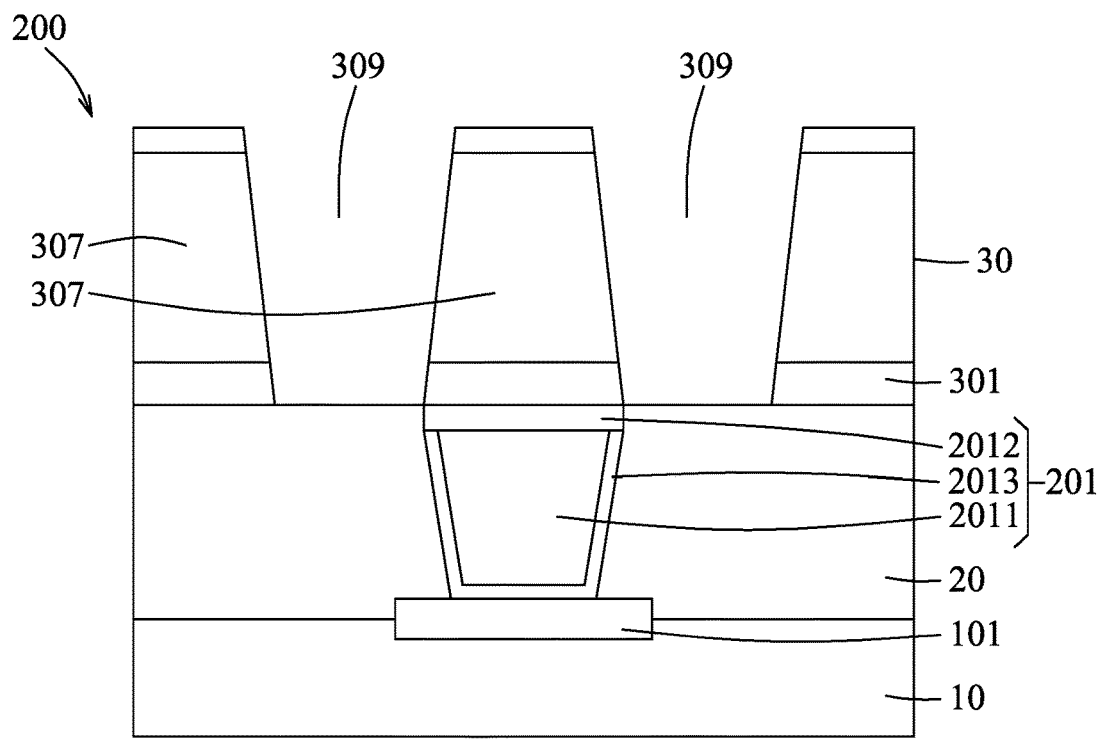
Figure 6:
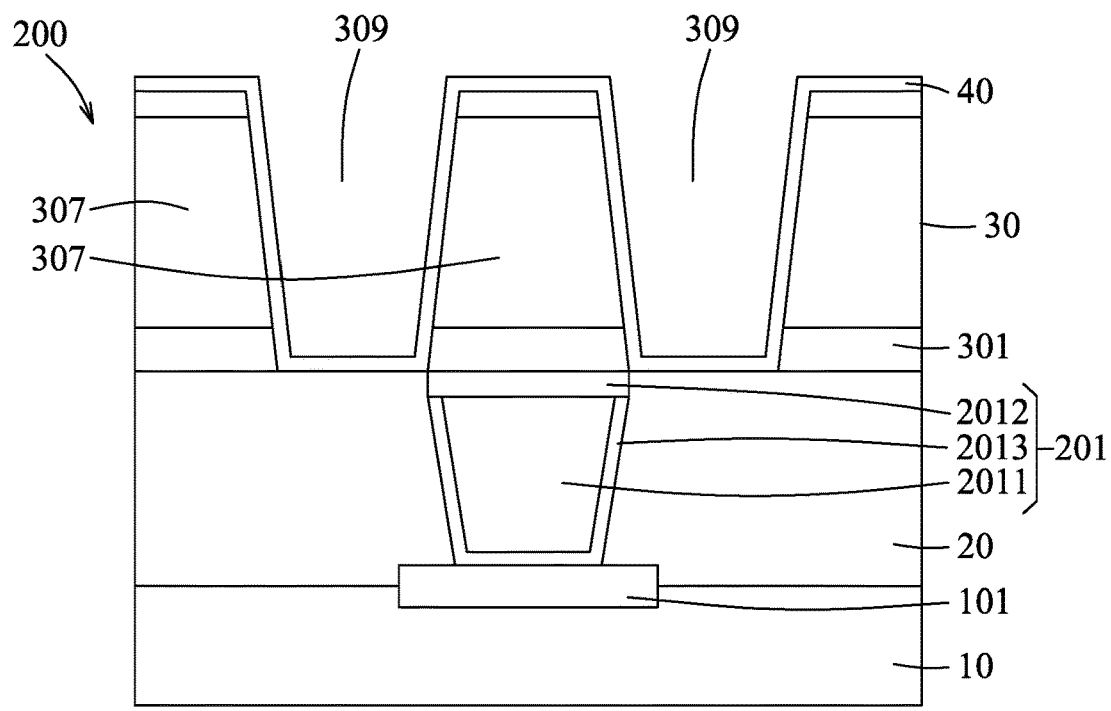
Figure 7:
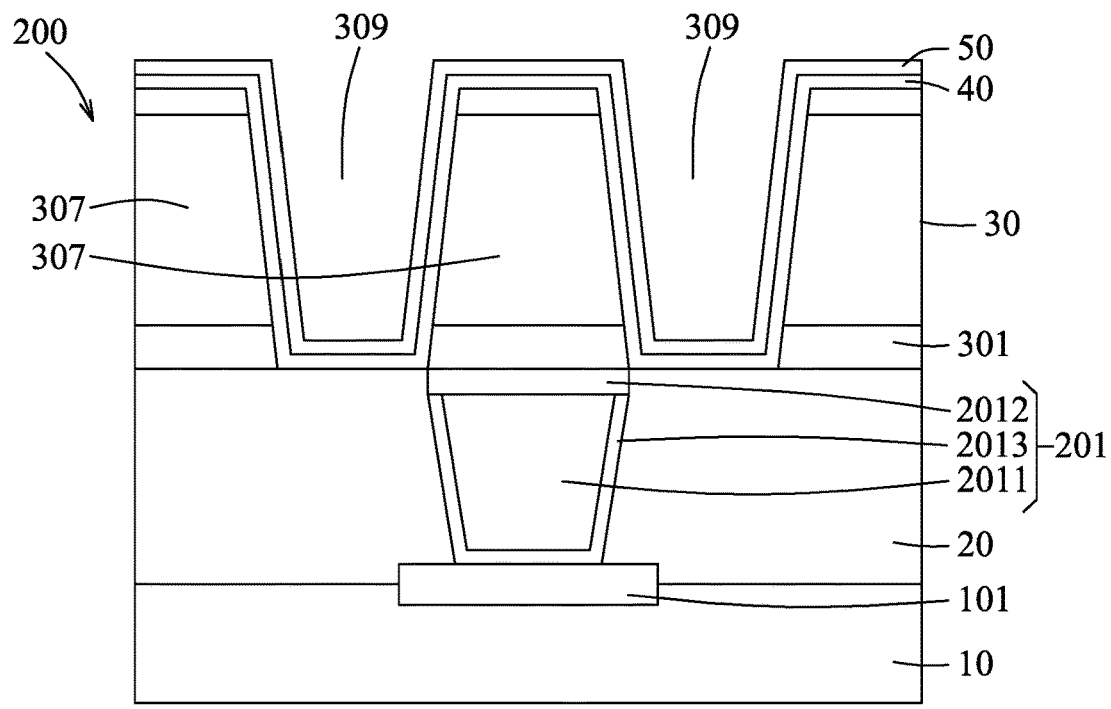
Figure 8:
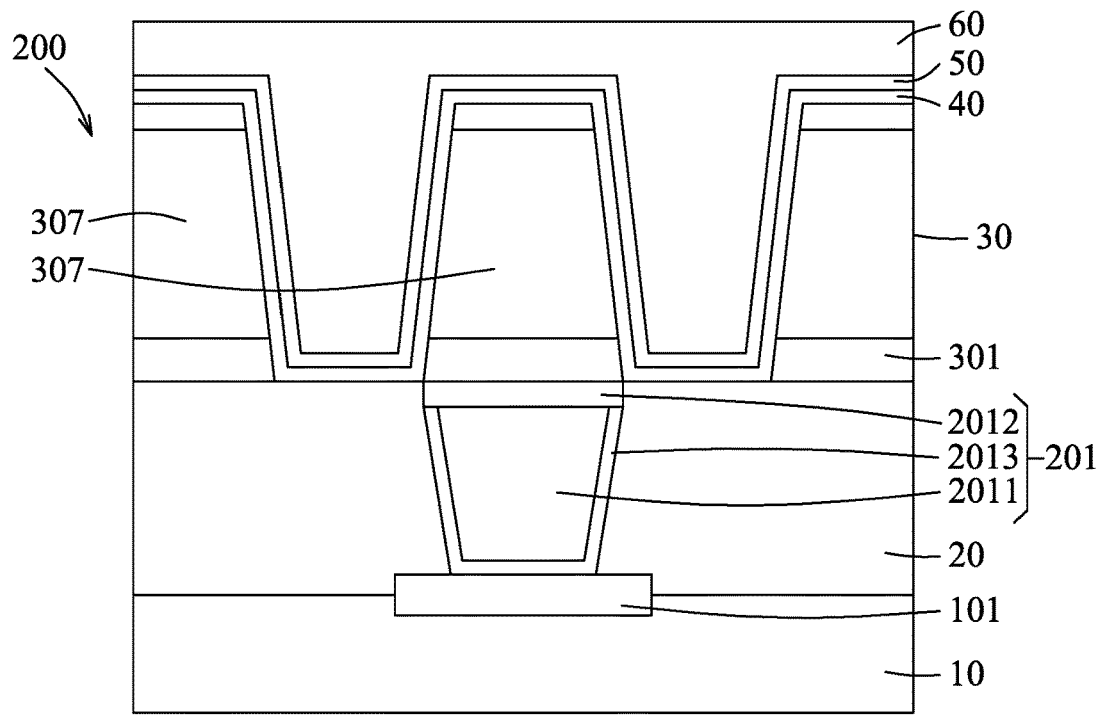
Figure 9:
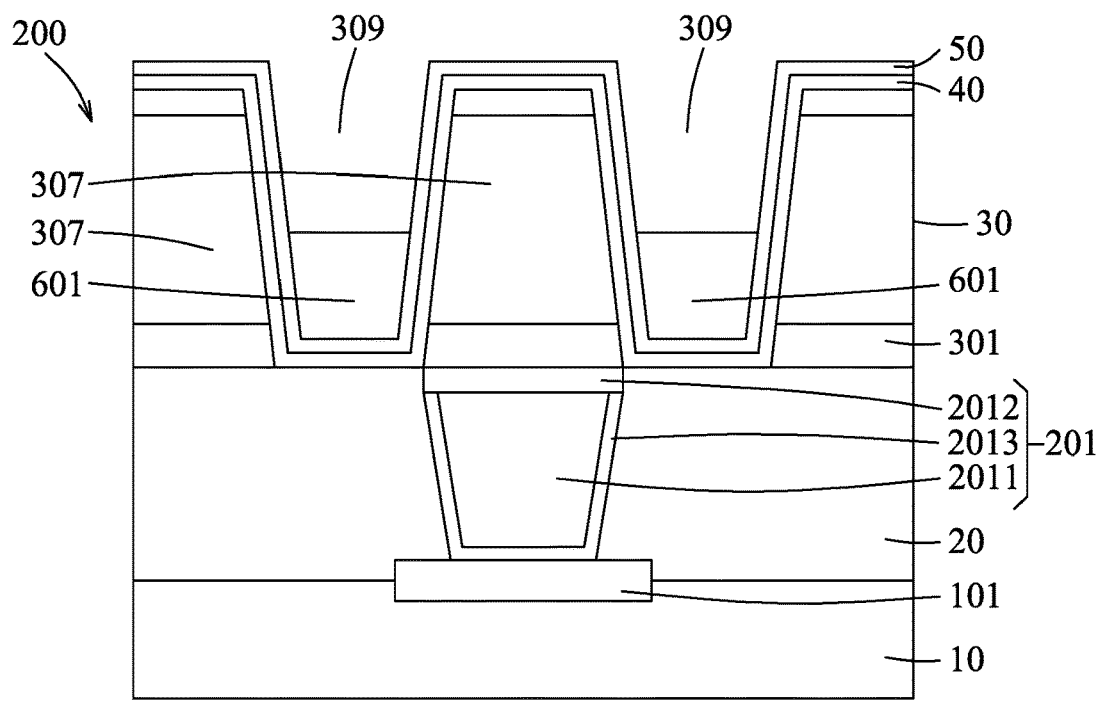
Figure 10:
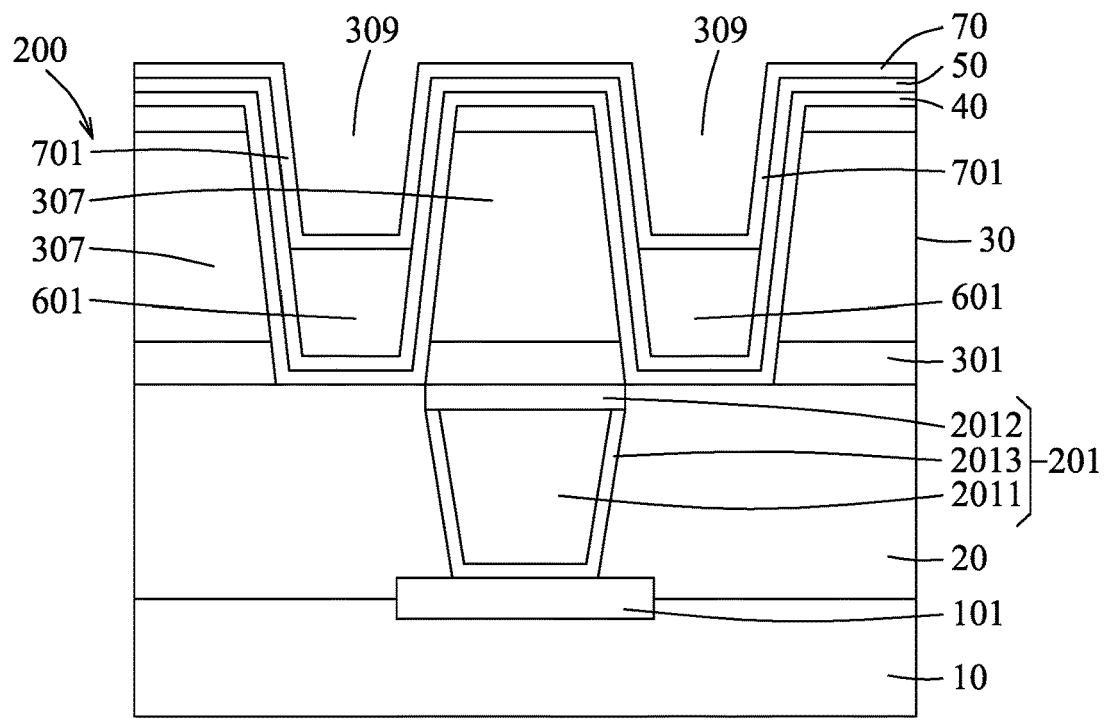
Figure 11:
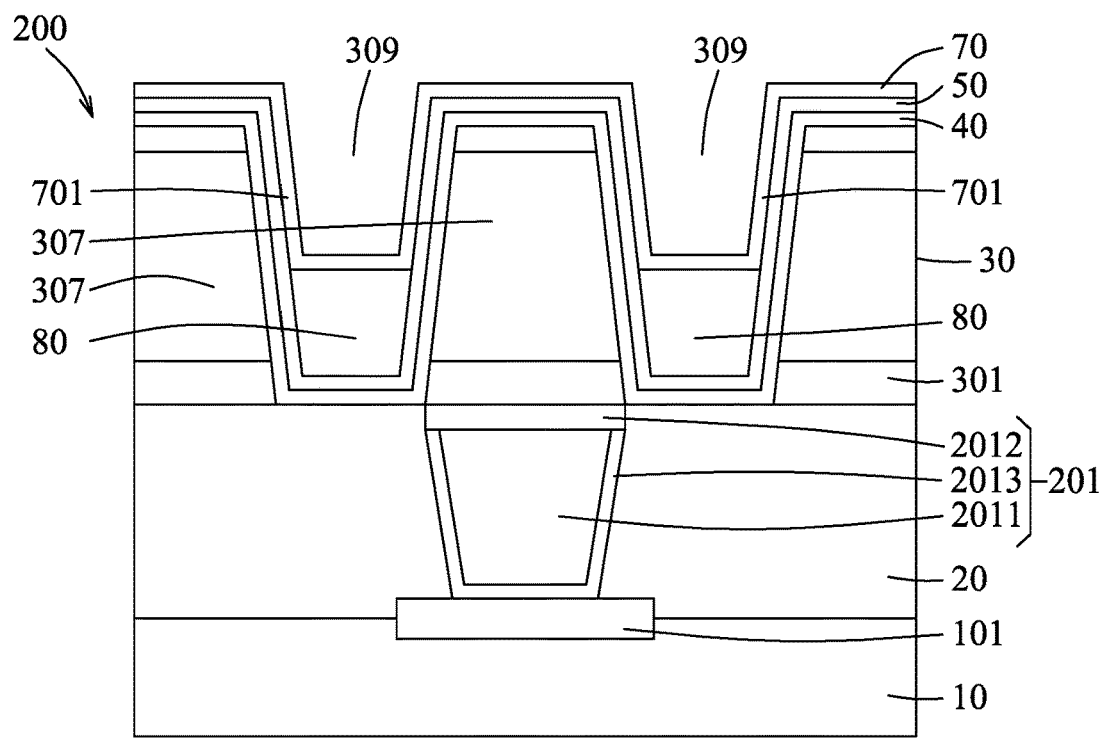
Figure 12:
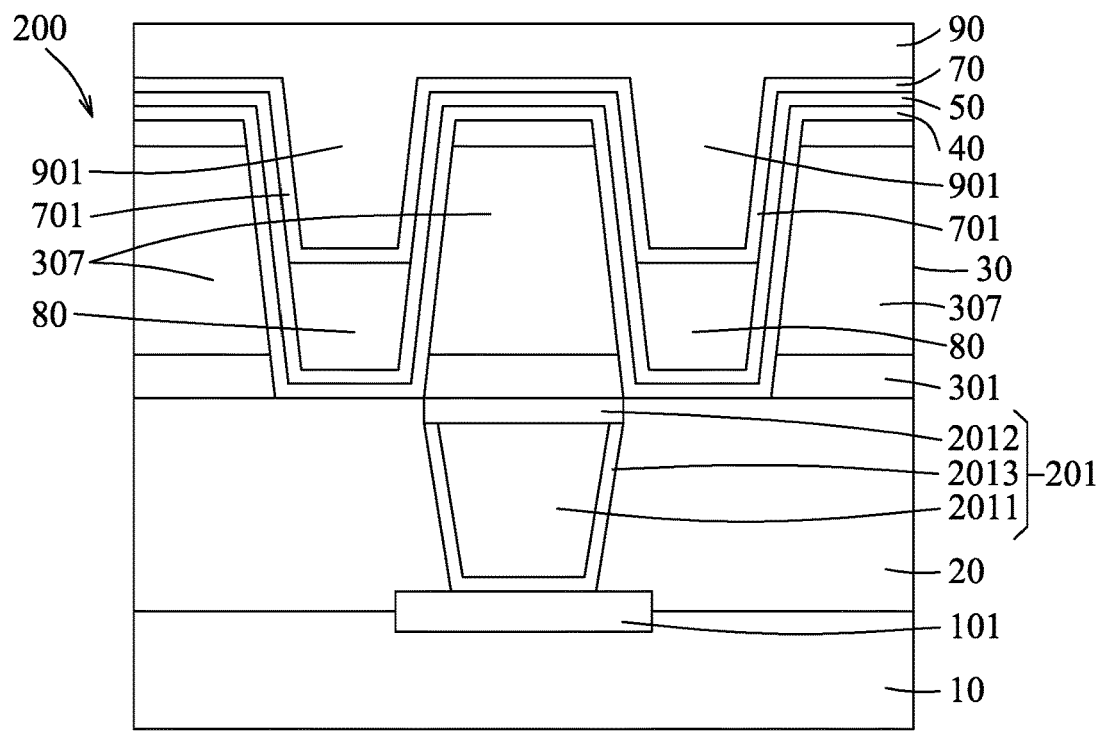
Figure 13:
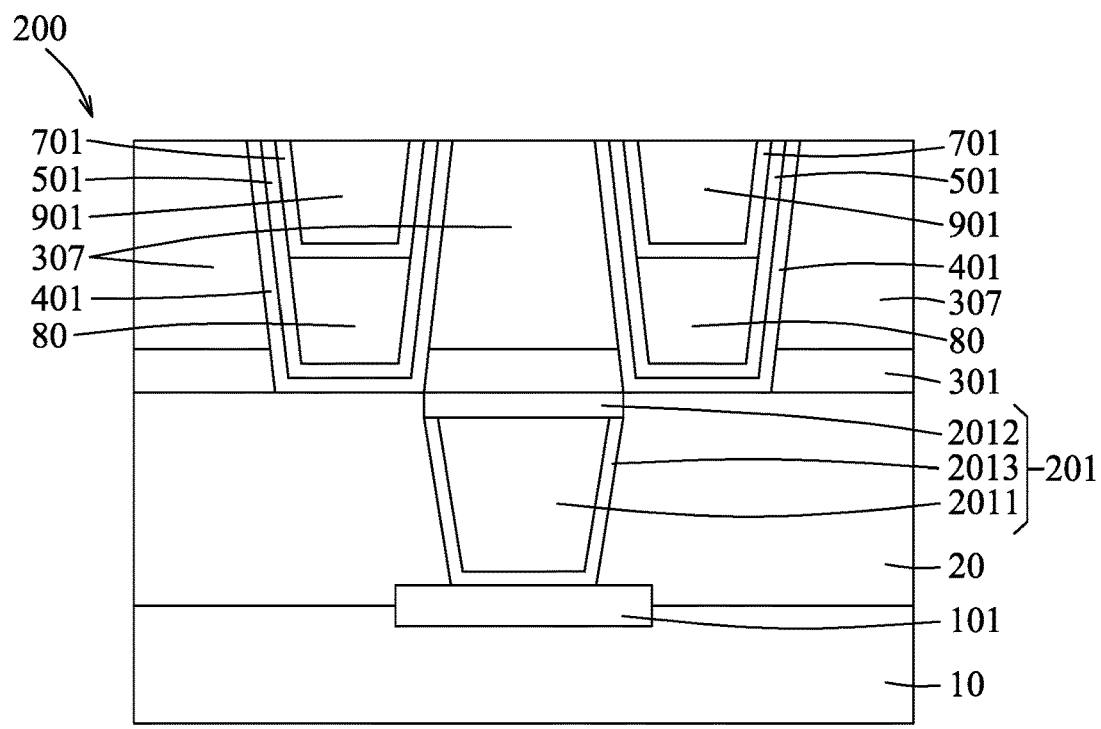
Figure 14:
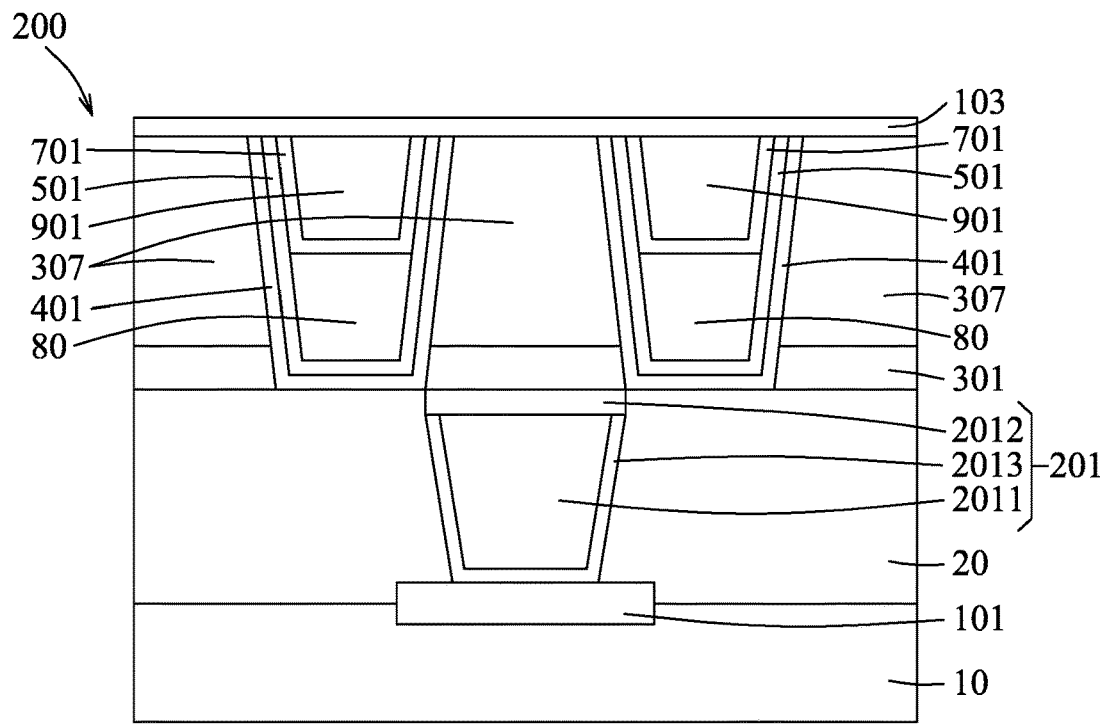
Figure 15:
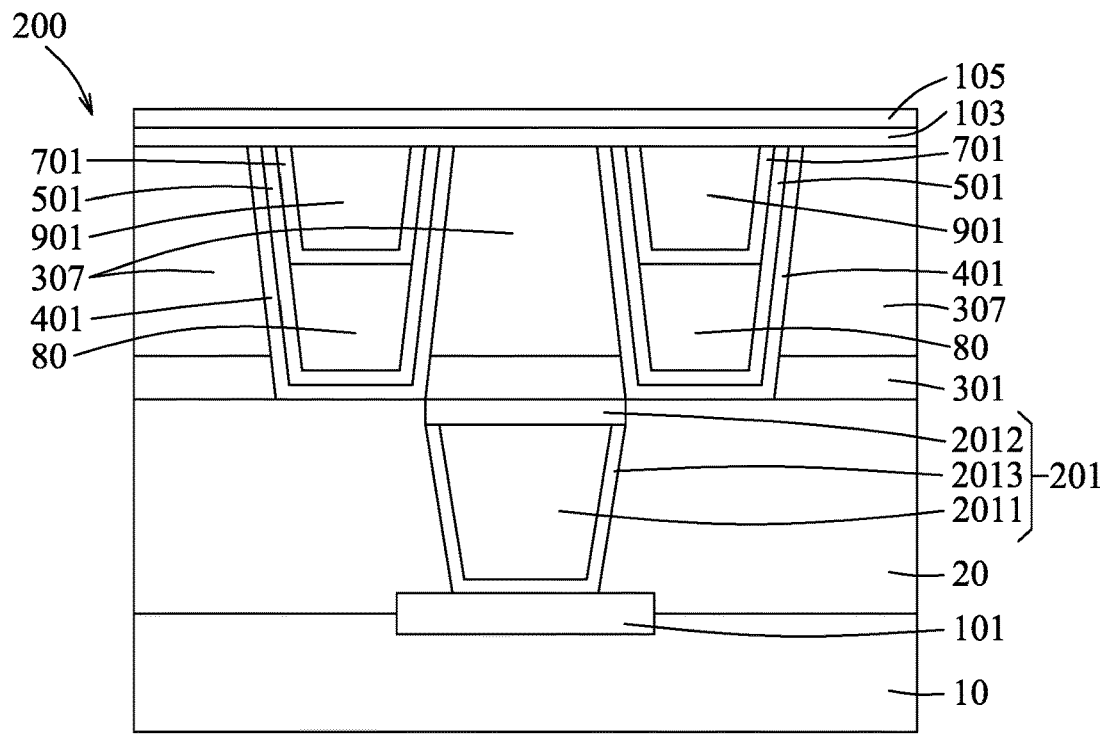
Figure 16:
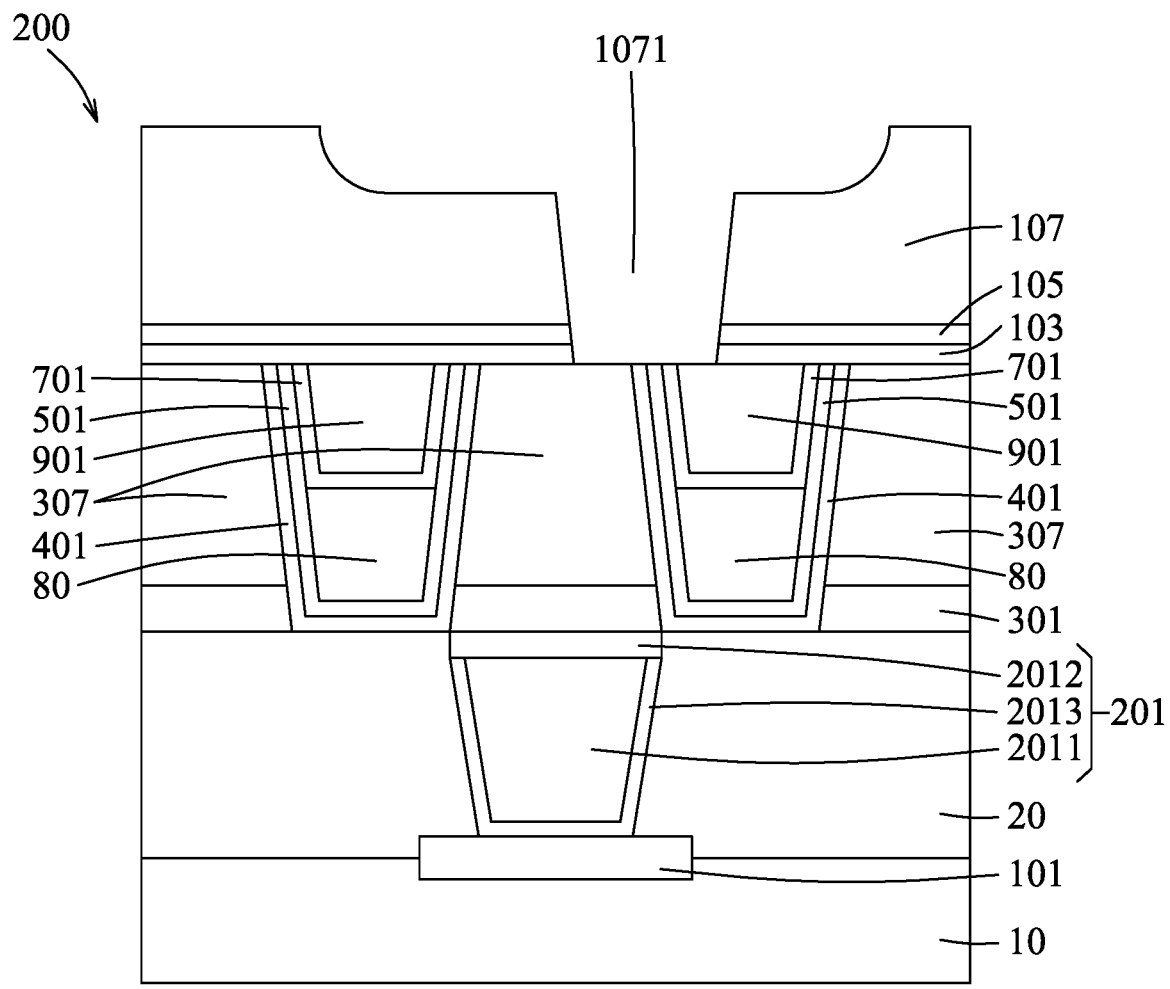

Referring specifically to the example illustrated in FIGS. 4 and 5, the mask layer 305 is patterned using photolithography and photoresist developing technology as is known to those skilled in the art of semiconductor fabrication. For example, the mask layer 305 may be patterned by 193 nm immersion lithography or extreme ultraviolet (EUV) lithography. A pattern 3051 formed in the patterned mask layer 305 is then transferred to the metal layer 303 and the glue layer 301 by one or more etching processes to form the electrically conductive structure 30 including a plurality of electrically conductive features 307 (for example, electrically conductive metal lines), two of which are spaced apart from each other by a corresponding one of recesses 309. The etching process for forming the electrically conductive features 307 may be implemented by reactive ion etching (RIE), plasma etching, deep RIE, atomic layer etching, etc., using an etching gas, such as $CHF_3$, $CH_2F_2$, $CF_4$, $C_4F_8$, $C_4F_6$, $N_2$, Ar, $O_2$, $NF_3$, $CO_2$, $H_2$, etc., but not limited thereto.

The method 100 then proceeds to block 104 wherein a thermally conductive dielectric capping layer is conformally formed on the electrically conductive structure. Referring to the example illustrated in FIG. 6, the electrically conductive structure 30 is subjected to deposition of a thermally conductive dielectric material thereon to conformally form a thermally conductive dielectric capping layer 40 on the electrically conductive structure 30. The thermally conductive dielectric capping layer 40 can provide good adhesion to the electrically conductive features 307. The deposition may be implemented by a suitable deposition process as is known to those skilled in the art of semiconductor fabrication, for example, PVD, CVD, plasma-enhanced chemical vapor deposition (PECVD), ALD, plasma-enhanced atomic layer deposition (PEALD), etc., or combinations thereof, but not limited thereto. Examples of the thermally conductive dielectric material suitable for forming the thermally conductive dielectric capping layer 40 include aluminum nitride, boron nitride (for example, hexagonal boron nitride (h-BN)), graphene oxide, diamond, silicon carbide, silicon carbonitride, and combinations thereof, but are not limited thereto. The thermally conductive dielectric capping layer 40 may have a thickness ranging from 2 Å to 50 Å.

The method 100 then proceeds to block 106 wherein a dielectric coating layer is conformally formed to cover the thermally conductive dielectric capping layer. Referring to the example illustrated in FIG. 7, a low-k dielectric material is deposited on the thermally conductive dielectric capping layer 40 to conformally form a dielectric coating layer 50 covering the thermally conductive dielectric capping layer 40. The dielectric coating layer 50 can provide good adhesion to the thermally conductive dielectric capping layer 40.

The thermally conductive dielectric capping layer 40 has a thermal conductivity higher than that of the dielectric coating layer 50. In some embodiments, a ratio of the thermal conductivity of the thermally conductive dielectric capping layer 40 to that of the dielectric coating layer 50 is at least 10.

The deposition for forming the dielectric coating layer 50 may be implemented by a suitable deposition process as is known to those skilled in the art of semiconductor fabrication, for example, PVD, CVD, PECVD, ALD, PEALD, etc., or combinations thereof, but not limited thereto. Examples of the low-k dielectric material suitable for forming the dielectric coating layer 50 include aluminum compounds (for example, aluminum nitride, aluminum oxynitride, aluminum oxide, etc.), silicon compounds (for example, silicon oxide, silicon oxycarbide, silicon oxynitride, silicon carbonitride, silicon oxycarbonitride (SiCON), etc.), and combinations thereof, but are not limited thereto. The dielectric coating layer 50 may have a thickness ranging from 2 Å to 50 Å.

The method 100 then proceeds to block 108 where a plurality of sacrificial features are formed in the recess structure. Referring to the example illustrated in FIGS. 8 and 9, a plurality of sacrificial features 601 are formed in the recesses 309 such that each of the sacrificial features 601 has a top surface lower than that of each of the electrically conductive features 307. Specifically, a sacrificial material is filled into the recesses 309 to form a sacrificial layer 60 covering the dielectric coating layer 50. The sacrificial layer 60 is then recessed to form the sacrificial features 601 in the recesses 309. The sacrificial material may be filled into the recesses 309 by a suitable method as is known to those skilled in the art of semiconductor fabrication, such as ALD, CVD, molecular layer deposition (MLD), spin-on deposition, etc., or combinations thereof, but not limited thereto. The sacrificial material is a sacrificial polymer; examples include polylactic acid, polycaprolactone, polyurea, poly(methyl methacrylate), poly(ethylene oxide), and combinations thereof, but are not limited thereto. Recessing the sacrificial layer 60 may be conducted by a thermal recess treatment, an etching back treatment, or a combination thereof. The thermal recess treatment may be implemented at an annealing temperature ranging from 200° C. to 400° C. for an annealing time period ranging from 5 minutes to 40 minutes. The etching back treatment may be implemented by a suitable anisotropic etching (for example, anisotropic dry etching, but not limited thereto) at room temperature for a time period ranging from 10 seconds to 300 seconds. The heights of the sacrificial features 601 may be controlled by adjusting the operation parameters for the thermal recess treatment or the etching back treatment. In some embodiments, the height of the sacrificial feature 601 is from 0.1 to 0.9 of a height from a top surface of a bottom portion of the dielectric coating layer 50 to a top surface of the electrically conductive feature 307. In some embodiments, the heights of the sacrificial features 601 may range from 10 Å to 100 Å.

The method 100 then proceeds to block 110 wherein a sustaining layer is formed. Referring to the example illustrated in FIG. 10, a low-k dielectric material is conformally deposited on the dielectric coating layer 50 to form a sustaining layer 70 which is porous, so that the sacrificial features 601 can be removed by vaporizing and degassing through the sustaining layer 70 after a thermal treatment or an ultraviolet treatment further described below. The sustaining layer 70 extends into the recesses 309 to cover the sacrificial features 601. The porosity of the sustaining layer 70 may be produced by controlling deposition parameters for forming the sustaining layer 70, for example, using a plasma generated at a low temperature and/or at a low power, or adjusting a ratio of precursors for forming the sustaining layer 70. The porosity of the sustaining layer 70 may range from about 0.1% to 40%. The deposition for forming the sustaining layer 70 may be implemented by a suitable deposition process as is known to those skilled in the art of semiconductor fabrication, for example, PVD, CVD, ALD, PECVD, PEALD, etc., or combinations thereof, but not limited thereto. Examples of the low-k dielectric material suitable for forming the sustaining layer 70 include silicon oxide, silicon nitride, silicon carbide, silicon oxycarbide, silicon oxynitride, silicon carbonitride, silicon oxycarbonitride, and combinations thereof, but are not limited thereto. The sustaining layer 70 may have a thickness ranging from 2 Å to 100 Å, and is configured to include a plurality of sustaining caps 701 extending into the recesses 309. The bottom portions of the sustaining caps 701 may be formed into a flat, concave, or convex shape, depending on the operation parameters for forming the sustaining layer 70.

The method 100 then proceeds to block 112 where the sacrificial features are removed. Referring to the example illustrated in FIGS. 10 and 11, the sacrificial features 601 are removed so as to form air gaps 80 covered by the sustaining layer 70. In some embodiments in accordance with the present disclosure, the sacrificial features 601 may be removed by the thermal treatment, the ultraviolet treatment, or a combination thereof. In some embodiments, the sacrificial features 601 may be removed by a thermal treatment at a temperature ranging from 300° C. to 400° C. for a time period ranging from 10 seconds to 10 minutes to permit the sacrificial features 601 to vaporize and to degas through the sustaining layer 70. When the thermal treatment is implemented at a temperature lower than 300° C., the sacrificial features 601 may be removed insufficiently. On the other hand, when the thermal treatment is implemented at a temperature higher than 400° C., other materials involved in a back end of line (BEOL) process may be negatively affected. In addition, when the thermal treatment is implemented for a time period less than 10 seconds, the residual of the sacrificial features 601 may remain in the recesses 309, causing a particle issue. On the other hand, when the thermal treatment is implemented for a time period greater than 10 minutes, the thermal treatment would not be cost effective. In some embodiments, the sacrificial features 601 may be removed by an ultraviolet treatment at an ultraviolet exposure energy density ranging from 10 mJ/cm$^2$ to 100 mJ/cm$^2$ for a time period ranging from 10 seconds to 10 minutes. When the ultraviolet treatment is implemented at an ultraviolet exposure energy density lower than 10 mJ/cm$^2$, the residual of the sacrificial features 601 may remain in the recesses 309, causing a particle issue. On the other hand, when the ultraviolet treatment is implemented at an ultraviolet exposure energy density higher than 100 mJ/cm$^2$, other materials around the sacrificial features 601 may be damaged. In addition, when the ultraviolet treatment is implemented for a time period less than 10 seconds, the residual of the sacrificial features 601 may remain in the recesses 309, causing a particle issue. On the other hand, when the ultraviolet treatment is implemented for a time period greater than 10 minutes, the ultraviolet treatment would not be cost effective.

In some embodiments, each of the air gaps 80 thus formed has a top surface lower than that of each of the electrically conductive features 307. In some embodiments, the height of each of the air gaps 80 is from 0.1 to 0.9 of a height from a top surface of a bottom portion of the dielectric coating layer 50 to a top surface of the electrically conductive feature 307. In some embodiments, each of the air gaps 80 has a height ranging from 10 Å to 100 Å. A bottom of each of the air gaps 80 maybe or may not be coplanar with a top surface of the glue layer 301, depending on the thicknesses of the thermally conductive dielectric capping layer 40 and the dielectric coating layer 50. In some embodiments, the width of top of each of the air gaps 80 is greater than that of bottom thereof.

The method 100 then proceeds to block 114 where a dielectric cover layer is formed on the sustaining layer. Referring to the example illustrated in FIGS. 11 and 12, a low-k dielectric material is deposited on the sustaining layer 70 by a suitable deposition method as is known to those skilled in the art of semiconductor fabrication, such as CVD, ALD, PECVD, PEALD, spin-on deposition, etc., or combinations thereof, to form a dielectric cover layer 90 on the sustaining layer 70. The dielectric cover layer 90 includes a plurality of dielectric protruding features 901 extending into the recesses 309. An example of the low-k dielectric material for forming the dielectric cover layer 90 is SiCOH, which is a dielectric material containing silicon (Si), carbon (C), oxygen (O), and hydrogen (H) atoms. The dielectric cover layer 90 has good adhesion to the sustaining layer 70.

The method 100 then proceeds to block 116 where the dielectric cover layer is subjected to planarization. Referring to the example illustrated in FIGS. 12 and 13, the dielectric cover layer 90 is subjected to a suitable planarization process as is known to those skilled in the art of semiconductor fabrication, such as CMP, to remove a part of the dielectric cover layer 90, a part of the sustaining layer 70, and a part of the electrically conductive structure 30 to expose the dielectric protruding features 901 and the electrically conductive features 307 and to permit the semiconductor device 200 to be formed with a substantially flat top surface with the top surfaces of the dielectric protruding features 901 being horizontally flush with those of the electrically conductive features 307. The dielectric protruding features 901 are conformally covered by the sustaining caps 701, respectively, and the air gaps 80 are capped by the sustaining caps 701, respectively. Parts of the thermally conductive dielectric capping layer 40 and the dielectric coating layer 50 are also removed by the planarization process to form first dielectric spacer layers 401 and second dielectric spacer layers 501, respectively. Each of the first dielectric spacer layers 401, a corresponding one of the second dielectric spacer layers 501, and a corresponding one of the sustaining caps 701, constitute a spacer structure. The first dielectric spacer layers 401 have a thermal conductivity higher than that of the second dielectric spacer layers 501, and conformally cover lateral surfaces of the electrically conductive features 307. The second dielectric spacer layers 501 conformally cover the first dielectric spacer layers 401. The sustaining caps 701 are formed on the second dielectric spacer layers 501, respectively and cooperate with the second dielectric spacer layers 501, respectively to define the air gaps 80. Each of the air gaps 80 is defined by a corresponding one of the second dielectric spacer layers 501 and a bottom portion of a corresponding one of the sustaining caps 701.

The method 100 then proceeds to block 118 where a first etch stop layer is deposited. Referring to the example illustrated in FIG. 14, a first etch stop layer 103 is deposited by a suitable deposition method as is known to those skilled in the art of semiconductor fabrication, such as PVD, CVD, ALD, PECVD, PEALD, etc., or combinations thereof to cover the dielectric protruding features 901 and the electrically conductive features 307. The first etch stop layer 103 is thermally conductive and may have a thickness ranging from 2 Å to 200 Å. The first etch stop layer 103 is made of a thermally conductive dielectric material, examples of which include aluminum nitride, boron nitride (for example, h-BN), graphene oxide, diamond, silicon carbide, silicon carbonitride, and combinations thereof, but are not limited thereto.

The method 100 then proceeds to block 120 where a second etch stop layer is deposited. Referring to the example illustrated in FIG. 15, a second etch stop layer 105 is deposited on the first etch stop layer 103 by a suitable deposition method as is known to those skilled in the art of semiconductor fabrication, such as PVD, CVD, ALD, PECVD, PEALD, etc., or combinations thereof. The second etch stop layer 105 may have a thickness ranging from 2 Å to 200 Å. The first etch stop layer 103 has a thermal conductivity higher than that of the second etch stop layer 105. The second etch stop layer 105 may be made of aluminum compounds (for example, aluminum nitride, aluminum oxynitride, aluminum oxide, etc.), silicon compounds (for example, silicon oxide, silicon oxycarbide, silicon oxynitride, silicon carbonitride, silicon oxycarbonitride (SiCON), etc.), or combinations thereof, but are not limited thereto.

The method 100 then proceeds to block 122 where a patterned dielectric layer is formed on the second etch stop layer. Referring to the example illustrated in FIG. 16, a low-k dielectric layer is deposited on the second etch stop layer 105 by a suitable deposition method as is known to those skilled in the art of semiconductor fabrication, such as PVD, CVD, ALD, PECVD, PEALD, etc., or combinations thereof. Examples of a low-k dielectric material suitable for forming the low-k dielectric layer include silicon oxide, silicon nitride, silicon carbide, silicon oxycarbide, silicon oxynitride, silicon carbonitride, silicon oxycarbonitride, and combinations thereof, but are not limited thereto. The low-k dielectric layer is patterned by an etching process through a pattern opening of a patterned mask layer (now shown) to form a patterned dielectric layer 107 having a through hole 1071.

The method 100 then proceeds to block 124 where parts of the first and second etch stop layers are removed. Referring to the example illustrated in FIG. 16, the second etch stop layer 105 and the first etch stop layer 103 are further patterned by one or more etching processes to remove parts of the first and second etch stop layers 103, 105 exposed from the through hole 1071 so as to expose a corresponding one of the electrically conductive features 307 from the through hole 1071.

The method 100 then proceeds to block 126 where an electrically conductive interconnect is formed in the through hole. Referring the example illustrated in FIG. 17, an electrically conductive material is filled into the through hole 1071 to form an electrically conductive interconnect 109 electrically connected to the corresponding one of the electrically conductive features 307. Details regarding the formation of the electrically conductive interconnect 109 are the same as or similar to those regarding the formation of the recessed electrically conductive element 2011 described above with reference to FIG. 2. In addition, similarly to that described above with reference to FIG. 2, before filling copper or the like into the through hole 1071, the through hole 1071 may be lined with a barrier layer 1091 that prevents electromigration.

Figure 17:
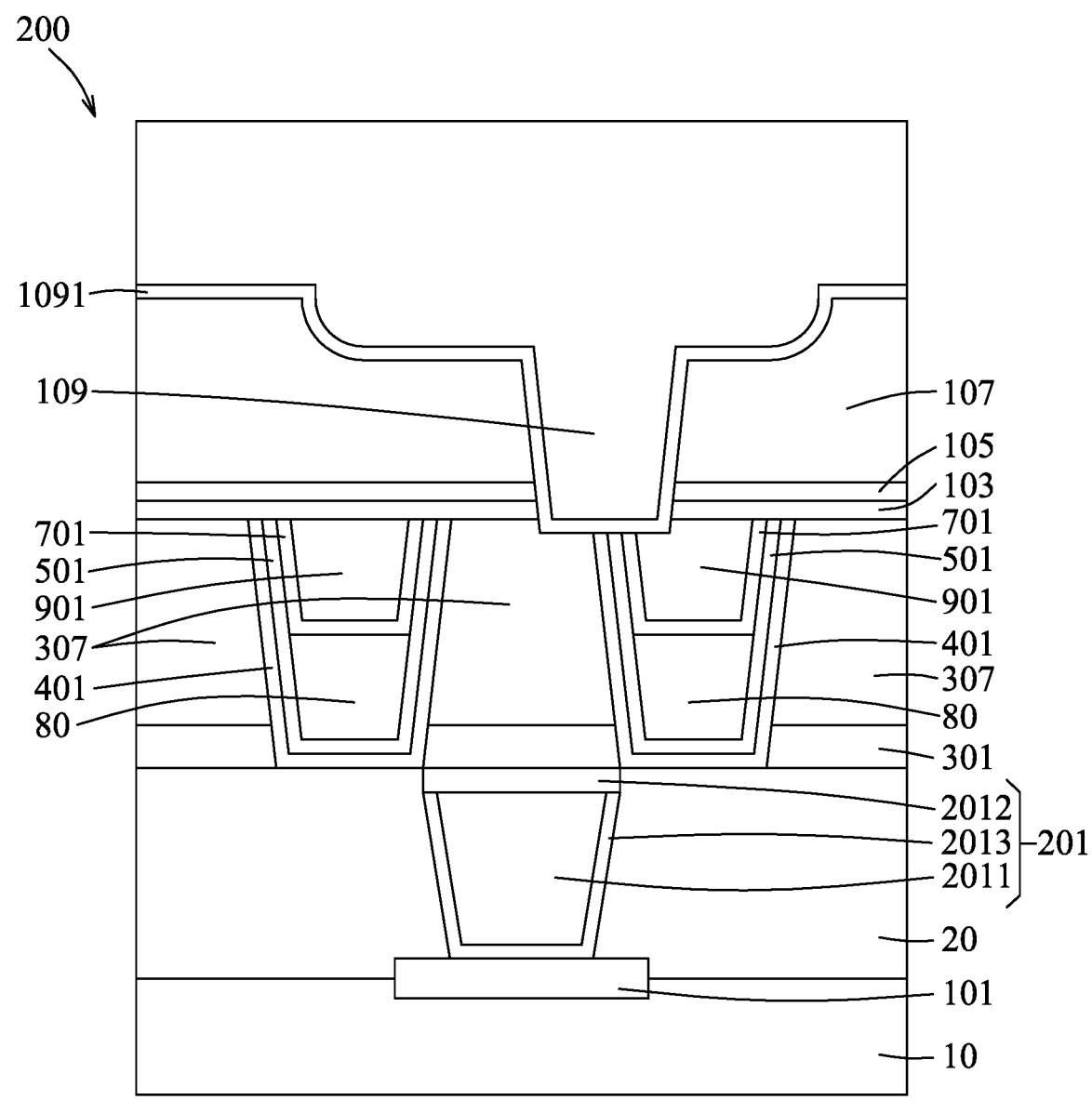

Referring to the example illustrated in FIG. 17, in the semiconductor structure 200, the air gaps 80 are formed among the electrically conductive features 307, and the second dielectric spacer layers 501 formed from the low-k dielectric material laterally cover the electrically conductive features 307. The semiconductor device 200 thus manufactured can provide a relatively low capacitance. Furthermore, the electrically conductive features 307 are covered by the first dielectric spacer layers 401 and the first etch stop layer 103, both of which are made of a dielectric material having a relatively high thermal conductivity, so the semiconductor device 200 can have good electromigration resistance.

Figure 18:
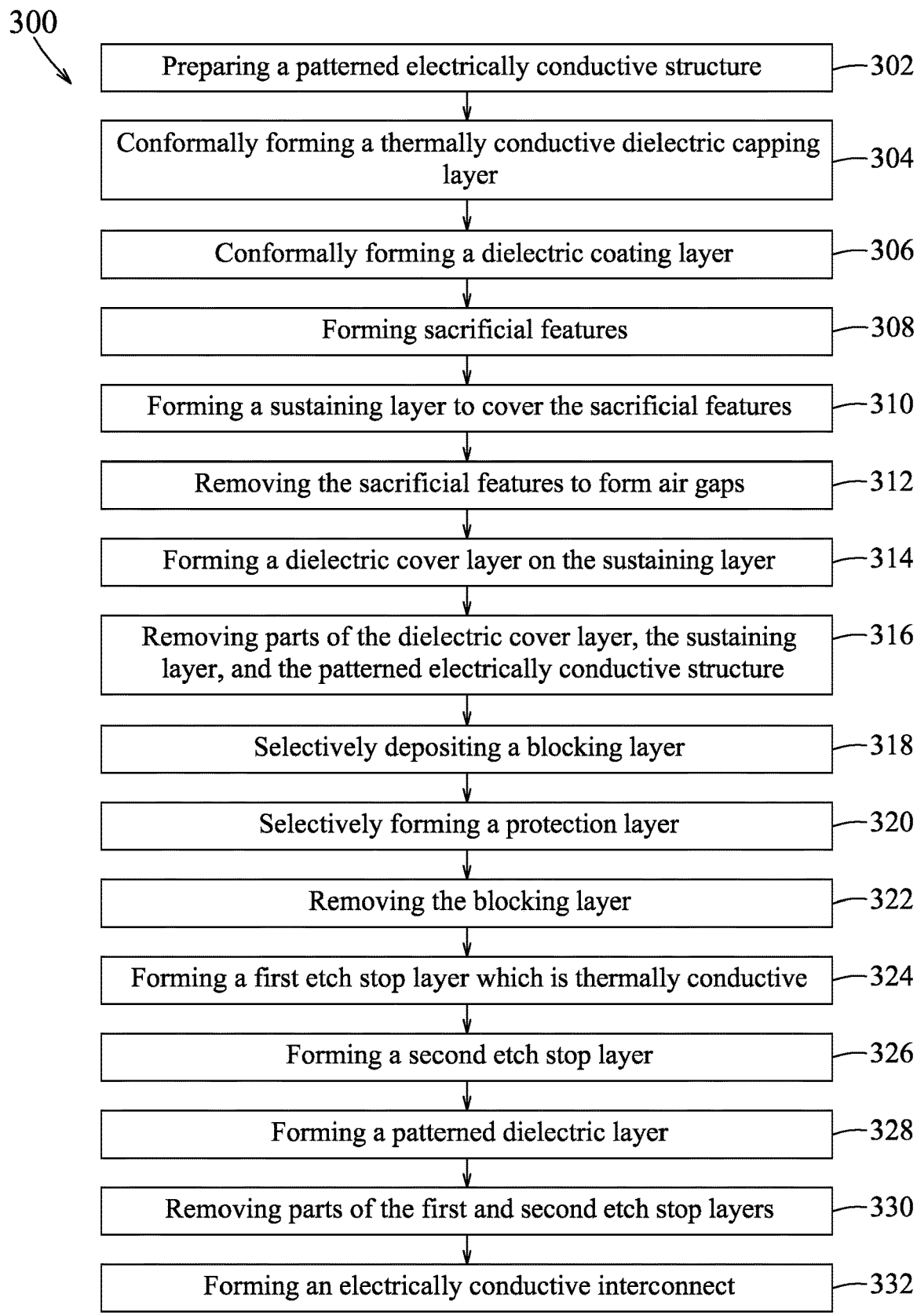
FIG. 18 is a flow diagram illustrating a method for manufacturing a semiconductor device having air gaps in accordance with some embodiments.
Figure 19:
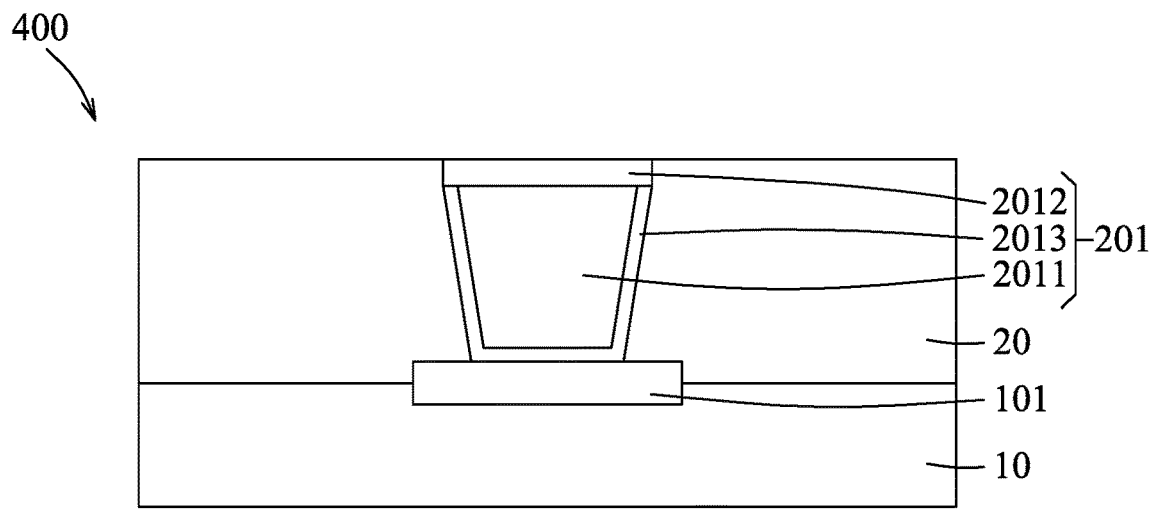
FIGS. 19 to 37 illustrate schematic views showing intermediate stages of the method for manufacturing a semiconductor device having air gaps as depicted in FIG. 18.
Figure 20:
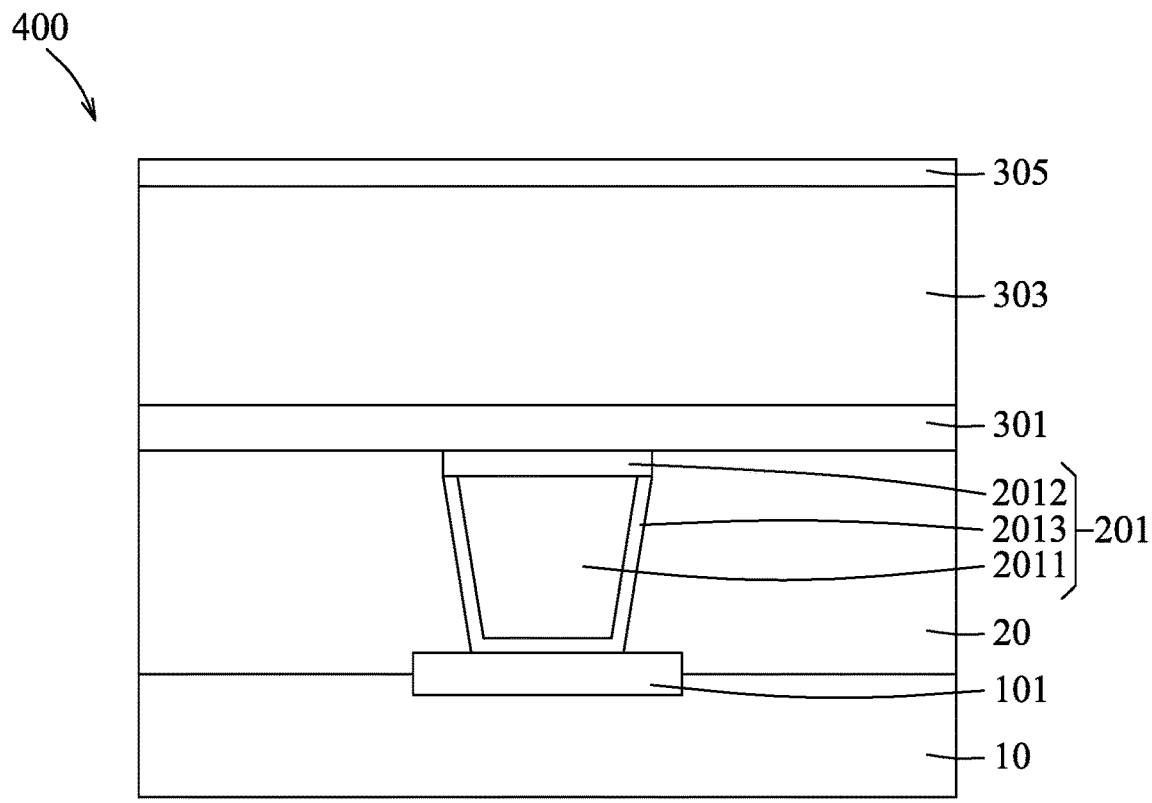
Figure 21:
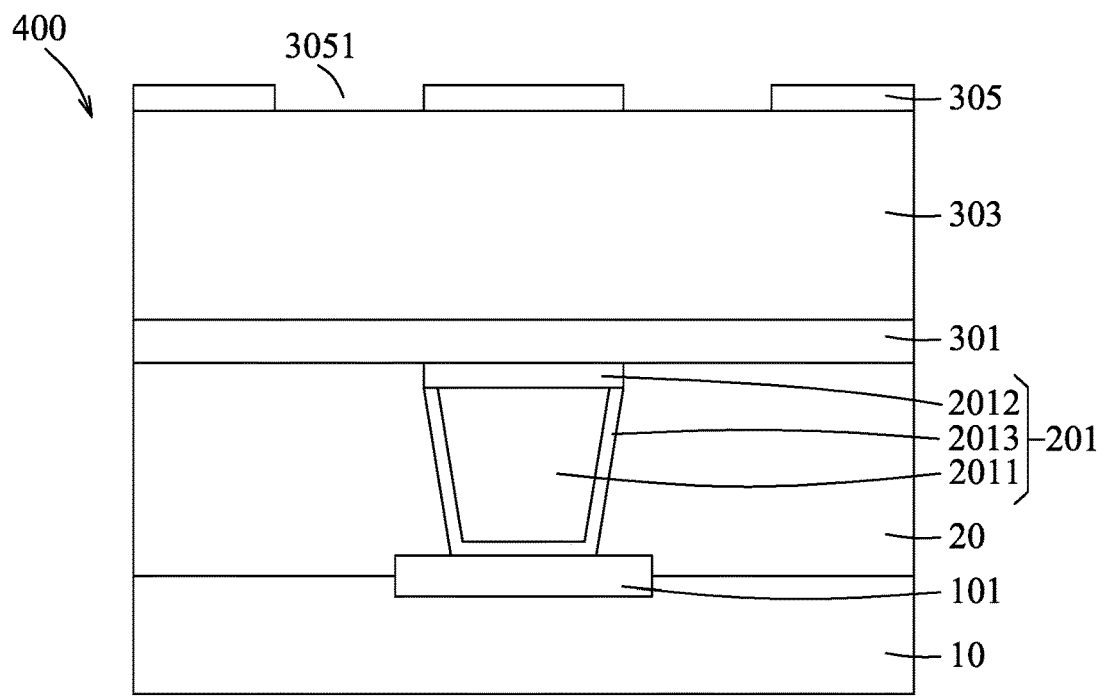
Figure 22:
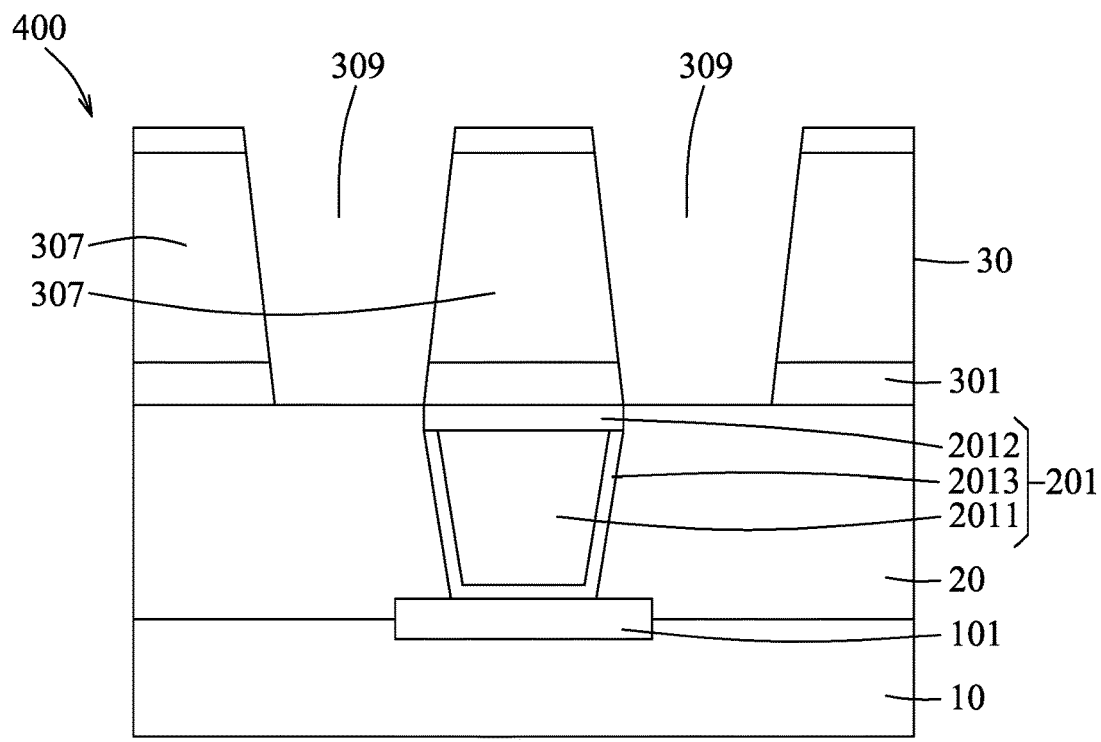
Figure 23:
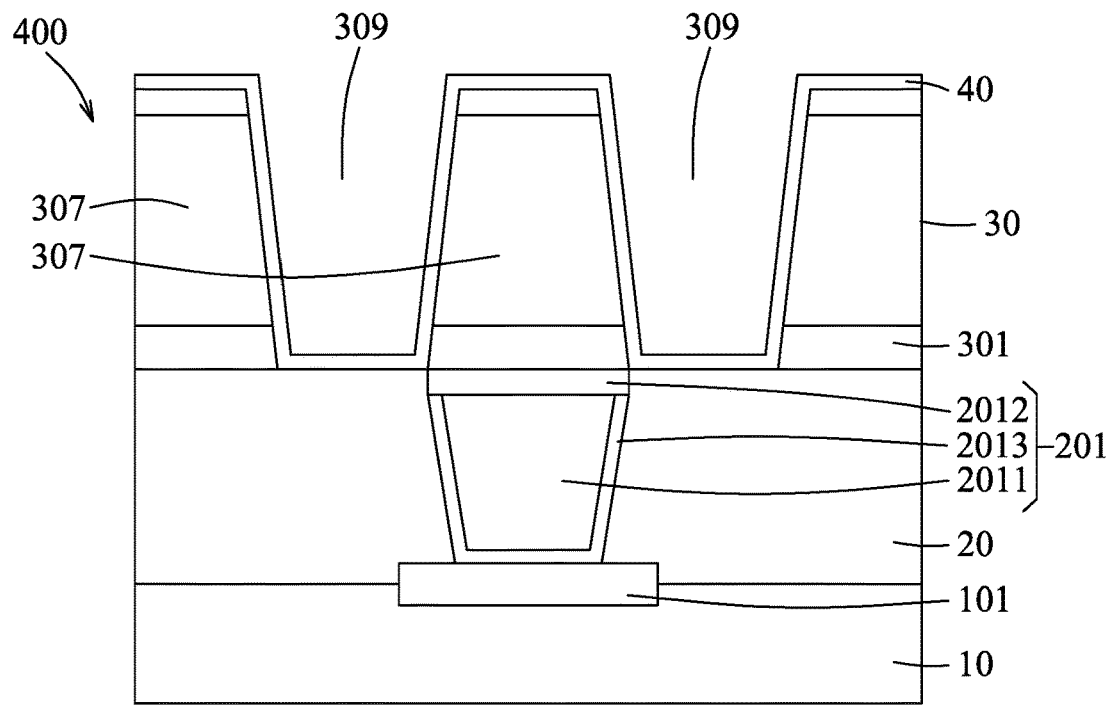
Figure 24:
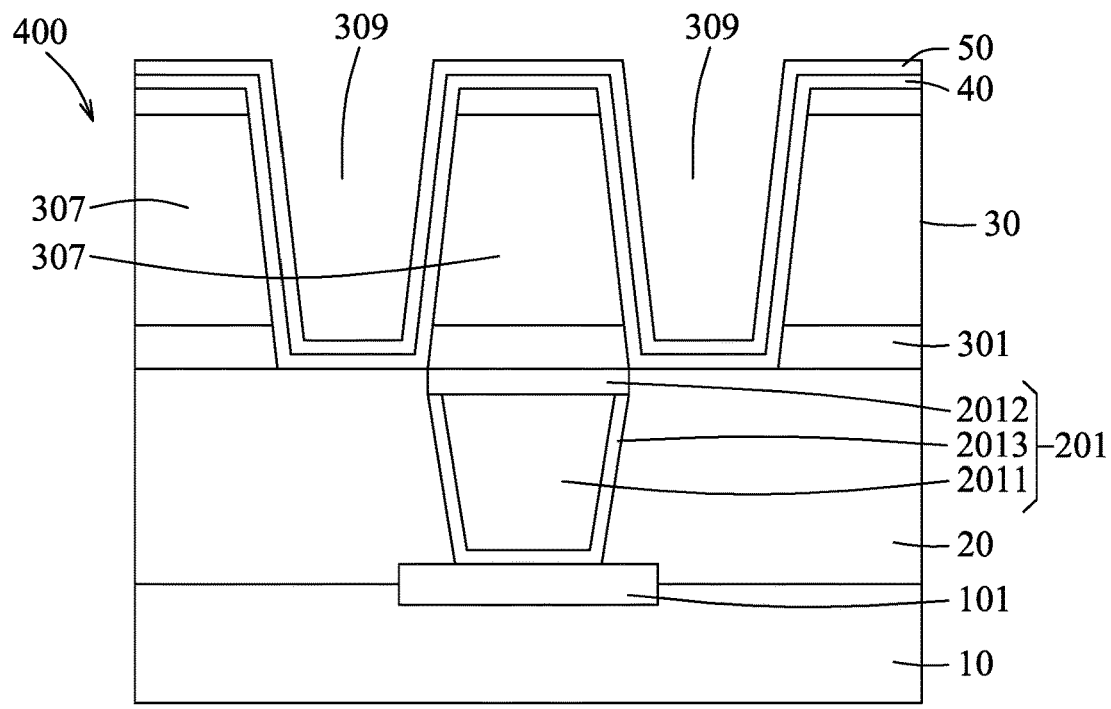
Figure 25:
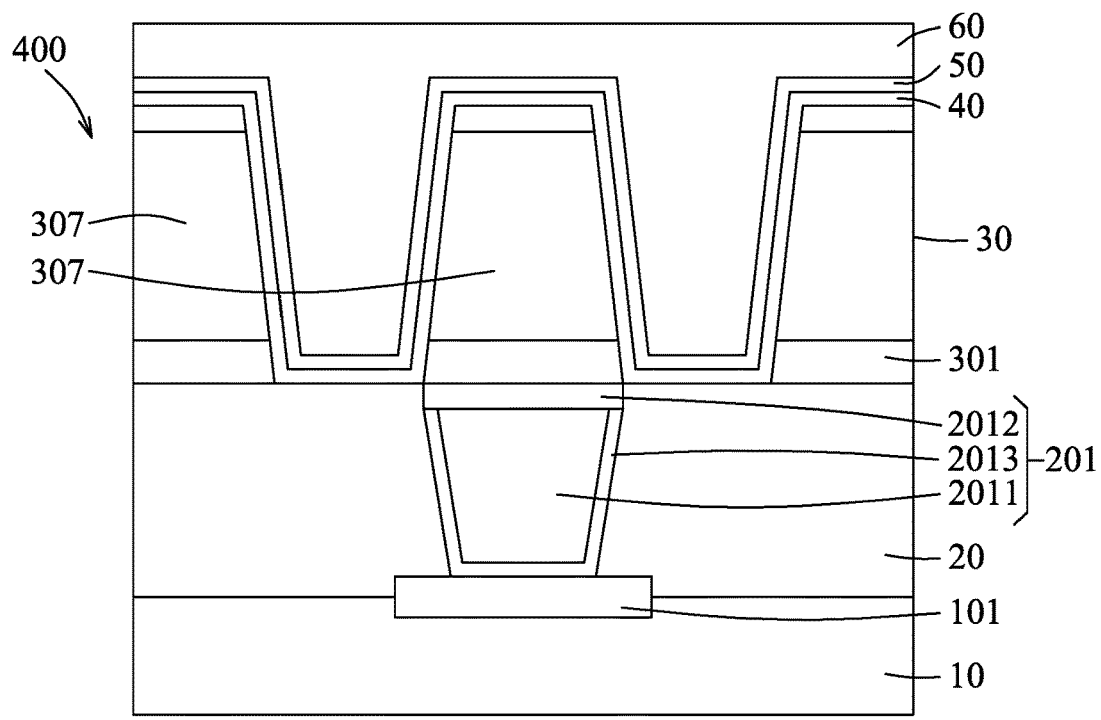
Figure 26:
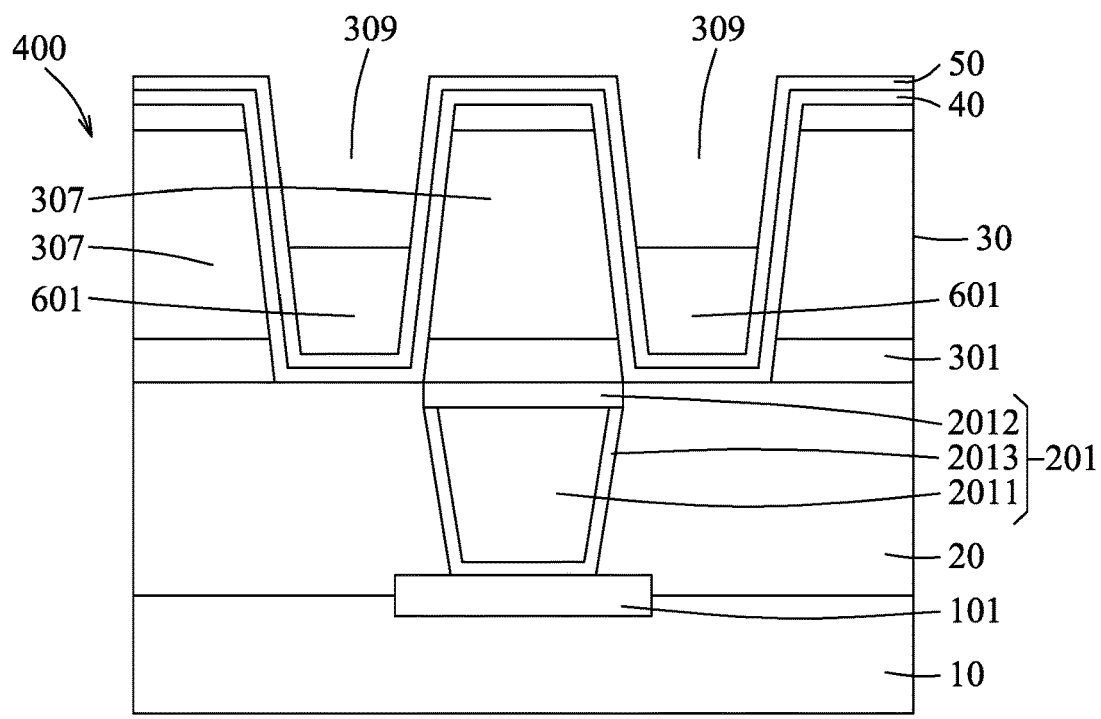
Figure 27:
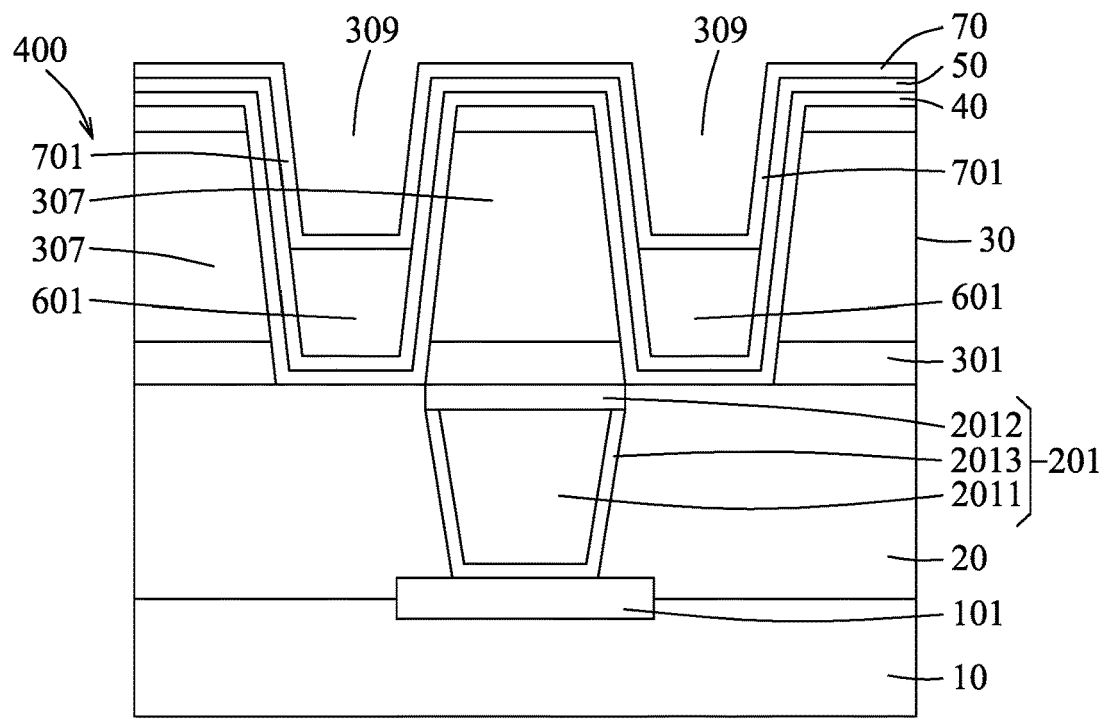
Figure 28:
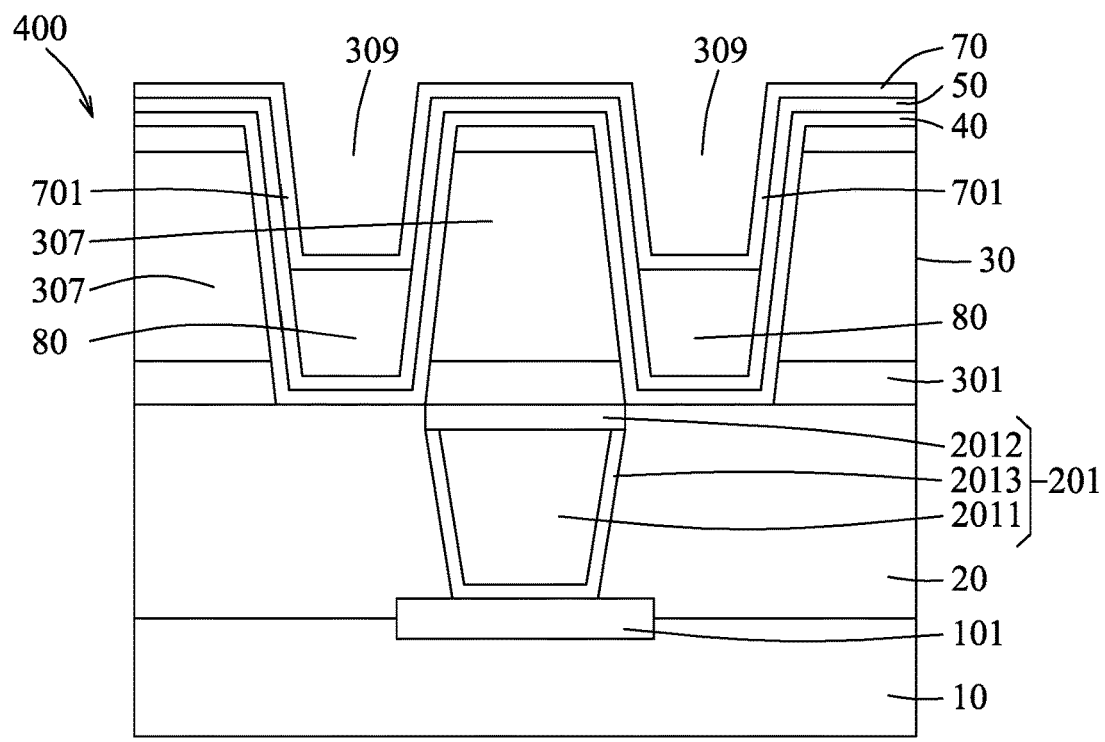
Figure 29:
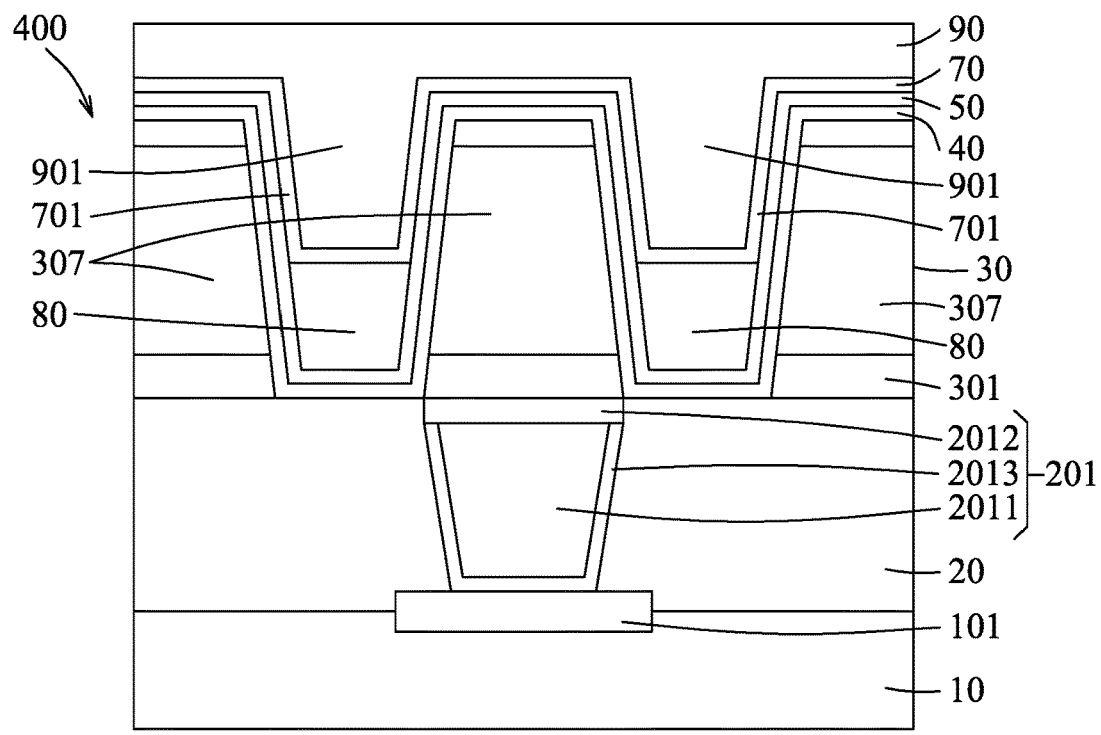
Figure 30:
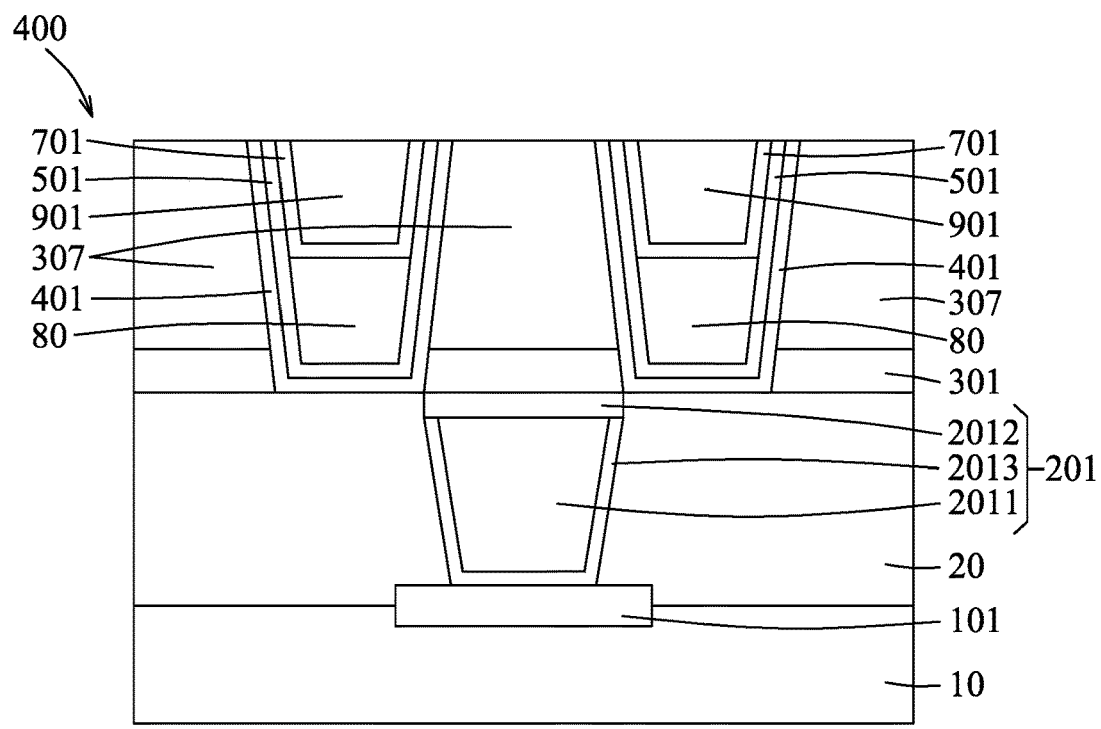
Figure 31:
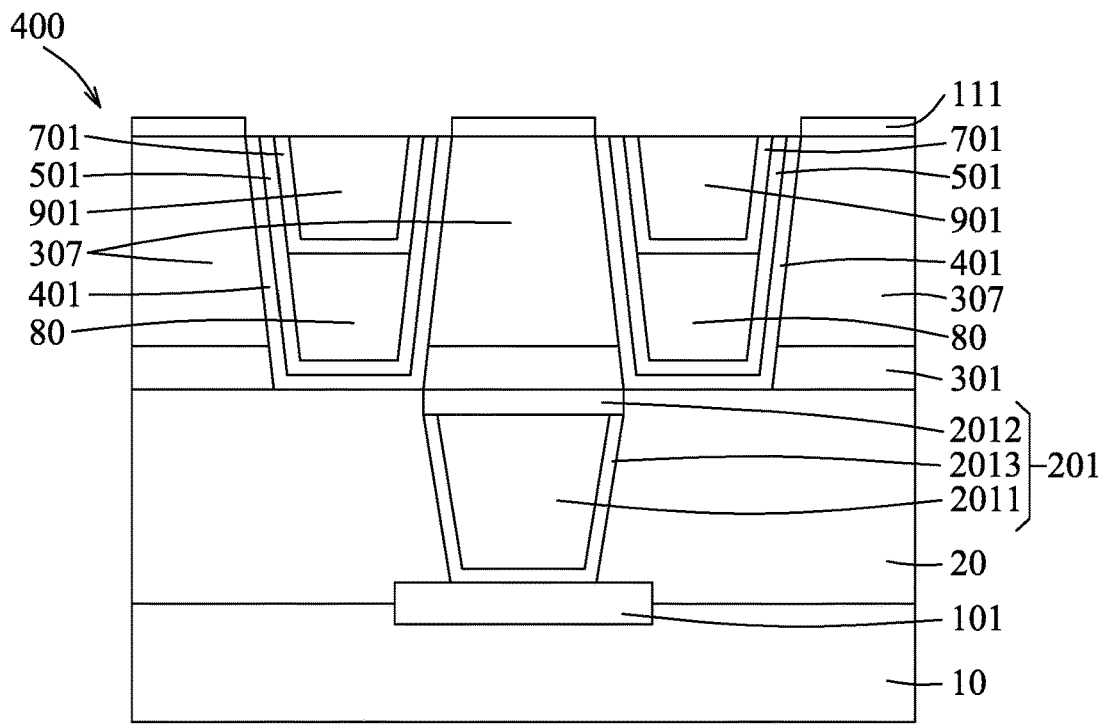
Figure 32:
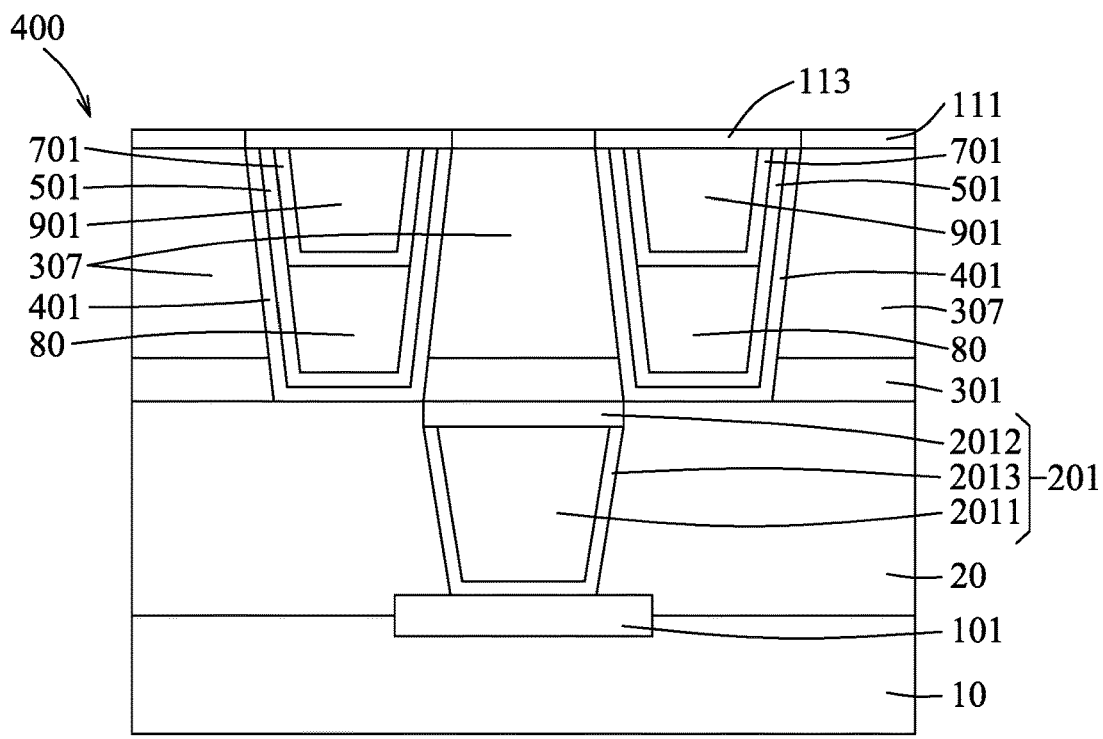
Figure 33:
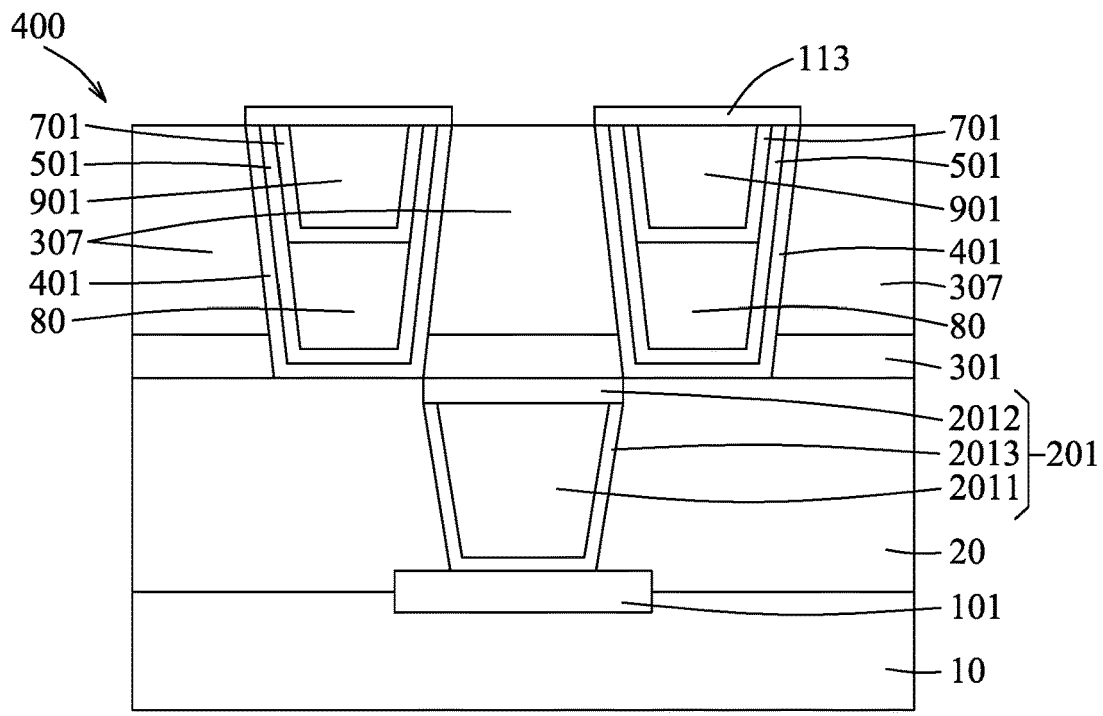
Figure 34:
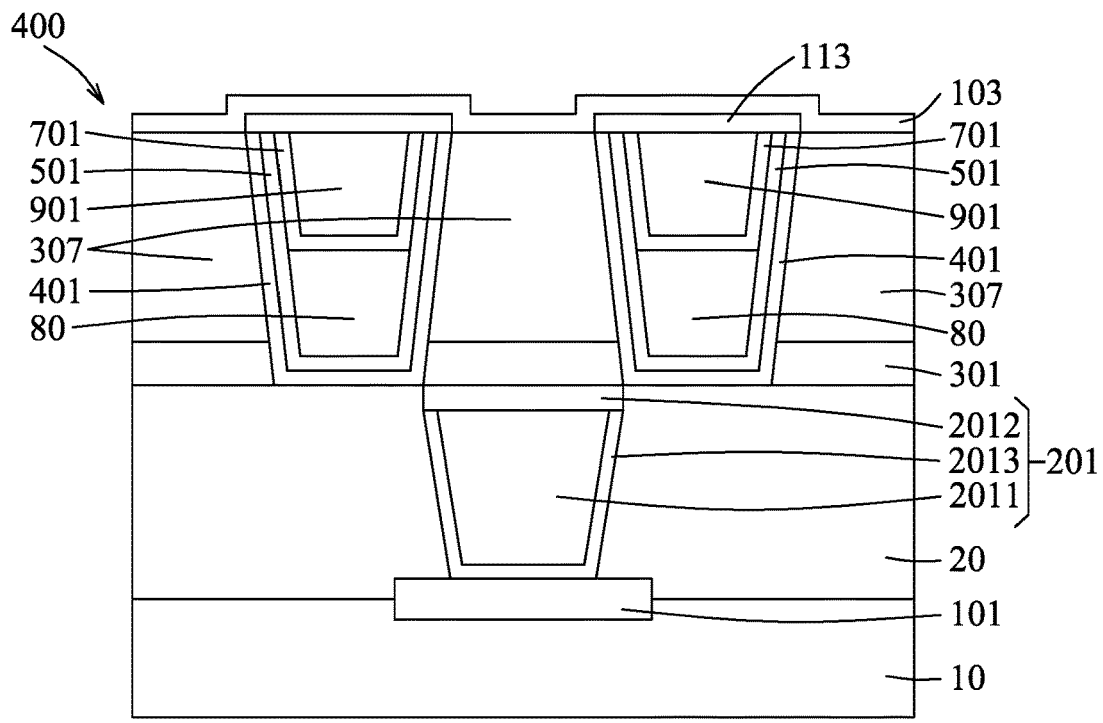
Figure 35:
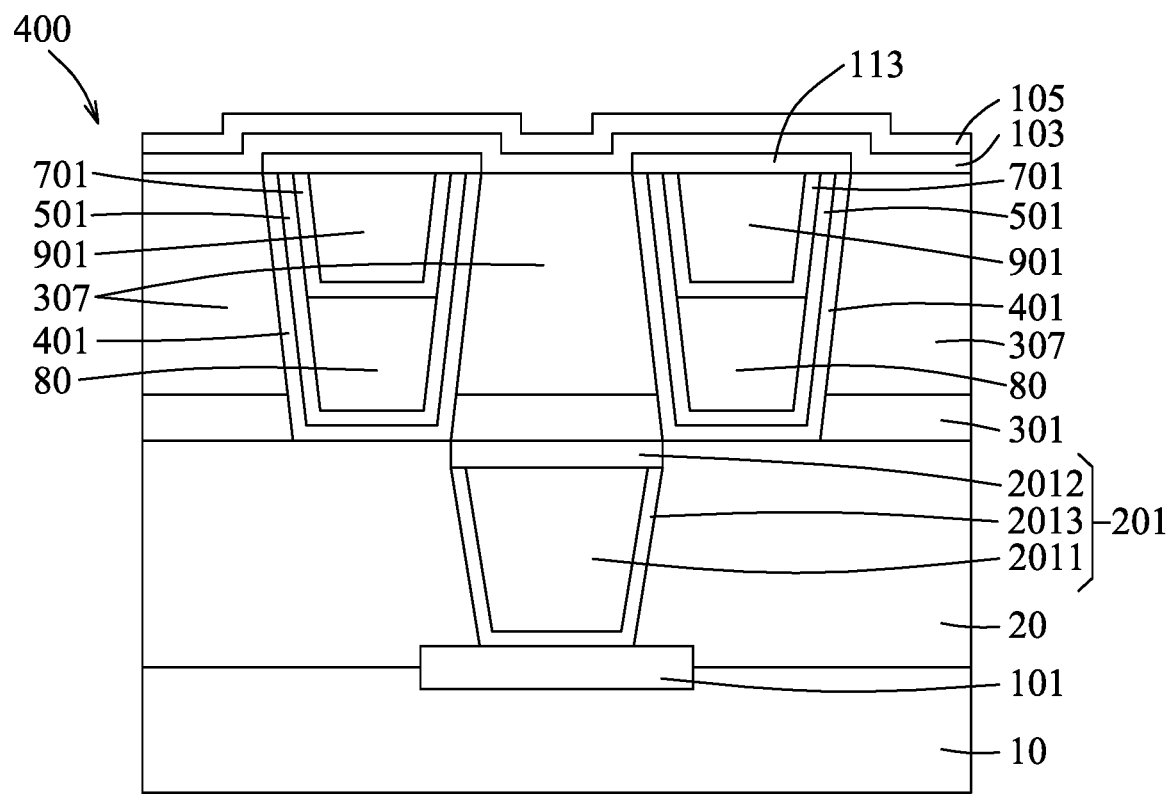
Figure 36:
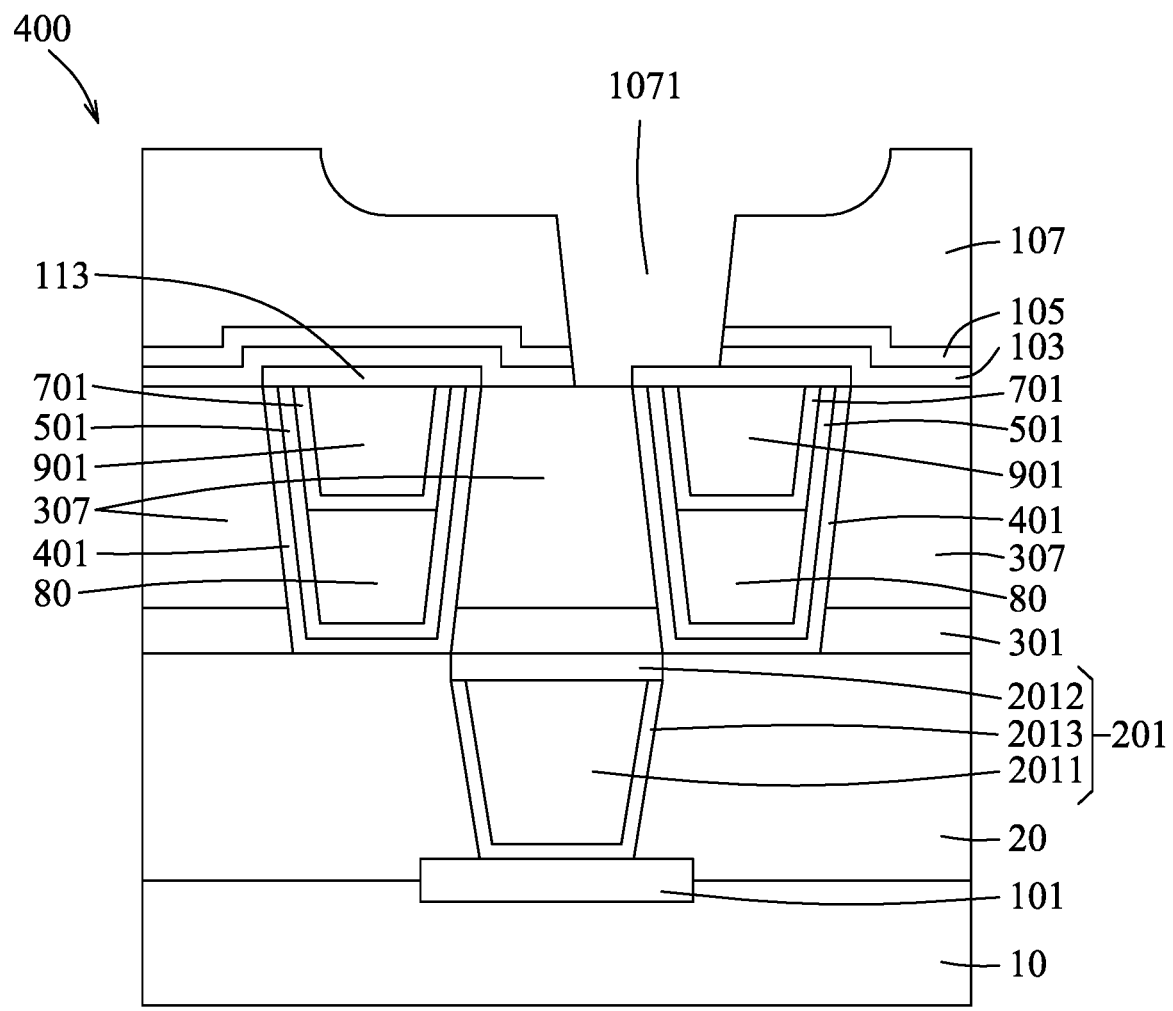

FIG. 18 illustrates a method 300 for manufacturing a semiconductor device in accordance with some embodiments. FIGS. 19 to 37 illustrate schematic views of a semiconductor device 400 during various stages of the method 300 of FIG. 18. The method 300 and the semiconductor device 400 are collectively described below. However, additional steps can be provided before, after or during the method 300, and some of the steps described herein may be replaced by other steps or be eliminated. Similarly, further additional features may be present in the semiconductor device 400, and/or features present may be replaced or eliminated in additional embodiments.

Referring to FIG. 18, the method 300 begins at block 302, where an electrically conductive structure is prepared. Referring to the example illustrated in FIGS. 19 to 22, an electrically conductive structure 30 is prepared on a first interconnect layer 20 disposed over a substrate 10. Details regarding the preparation of the electrically conductive structure 30 are the same as or similar to those described above with reference to FIGS. 2 to 5.

The method 300 then proceeds to block 304 wherein a thermally conductive dielectric capping layer is conformally formed on the electrically conductive structure. Referring to the example illustrated in FIG. 23, the electrically conductive structure 30 is subjected to deposition of a thermally conductive dielectric material thereon to conformally form a thermally conductive dielectric capping layer 40 on the electrically conductive structure 30. Details regarding the conformal formation of the thermally conductive dielectric capping layer 40 are the same as or similar to those described above with reference to FIG. 6.

The method 300 then proceeds to block 306 wherein a dielectric coating layer is conformally formed to cover the thermally conductive dielectric capping layer. Referring to the example illustrated in FIG. 24, a low-k dielectric material is deposited on the thermally conductive dielectric capping layer 40 to conformally form a dielectric coating layer 50 covering the thermally conductive dielectric capping layer 40. Details regarding the conformal formation of the dielectric coating layer 50 are the same as or similar to those described above with reference to FIG. 7.

The method 300 then proceeds to block 308 where a plurality of sacrificial features are formed in the recesses. Referring to the example illustrated in FIGS. 25 and 26, a plurality of sacrificial features 601 are formed in the recesses 309 such that each of the sacrificial features 601 has a top surface which is lower than that of each of the electrically conductive features 307. Details regarding the formation of the sacrificial features 601 are the same as or similar to those described above with reference to FIGS. 8 and 9.

The method 300 then proceeds to block 310 wherein a sustaining layer is formed. Referring to the example illustrated in FIG. 27, a low-k dielectric material is conformally deposited on the dielectric coating layer 50 to form a sustaining layer 70. Details regarding the formation of the sustaining layer 70 are the same as or similar to those described above with reference to FIG. 10.

The method 300 then proceeds to block 312 where the sacrificial features are removed. Referring to the example illustrated in FIGS. 27 and 28, the sacrificial features 601 are removed so as to form air gaps 80 covered by the sustaining layer 70. Details regarding the formation of the air gaps 80 are the same as or similar to those described above with reference to FIGS. 10 and 11.

The method 300 then proceeds to block 314 where a dielectric cover layer is formed on the sustaining layer. Referring to the example illustrated in FIG. 29, a low-k dielectric material is deposited on the sustaining layer 70 to form a dielectric cover layer 90 on the sustaining layer 70. Details regarding the formation of the dielectric cover layer 90 are the same as or similar to those described above with reference to FIG. 12. The dielectric cover layer 90 includes a plurality of protruding features 901.

The method 300 then proceeds to block 316 where the dielectric cover layer is subjected to planarization. Referring to the example illustrated in FIGS. 29 and 30, the dielectric cover layer 90 is subjected to a suitable planarization process as is known to those skilled in the art of semiconductor fabrication, such as CMP, to remove a part of the dielectric cover layer 90, a part of the sustaining layer 70, and a part of the electrically conductive structure 30 to expose the dielectric protruding features 901 and the electrically conductive features 307 and to permit the semiconductor device 200 to be formed with a substantially flat top surface with the top surfaces of the dielectric protruding features 901 being horizontally flush with those of the electrically conductive features 307. The dielectric protruding features 901 are conformally covered by the sustaining caps 701, respectively and the air gaps 80 are capped by the sustaining caps 701, respectively.

The method 300 then proceeds to block 318 where a blocking layer is selectively deposited on the electrically conductive features. Referring to the example illustrated in FIG. 31, a blocking layer 111 is selectively deposited on the electrically conductive features 307 by a suitable deposition method as is known to those skilled in the art of semiconductor fabrication, such as CVD, spin-on deposition, dipping deposition, etc., or combinations thereof, to permit the dielectric protruding features 901 to be exposed from the blocking layer 111. In some embodiments, the blocking layer 111 is made of an inhibitor, such as a self-assembling monolayer (SAM) material, which includes a head group containing nitrogen (N), phosphorus (P), sulfur (S), or silicon (Si). Examples of the SAM material including a nitrogen-containing head group include octylamine, octadecylamine, etc., but are not limited thereto. Examples of the SAM material including a phosphorus-containing head group include octylphosphonic acid, octadecylphosphonic acid, etc., but are not limited thereto. Examples of the SAM material including a sulfur-containing head group include 1-octanethiol, 1-octadecanethiol, etc., but are not limited thereto. Examples of the SAM material including a silicon-containing head group include triethoxy(octyl)silane, trimethoxy(octadecyl)silane, etc., but are not limited thereto. The head group of the SAM is used as an anchor to be selectively bonded to the surface of the electrically conductive features 307. In some embodiments, the head group of SAM may include nitrate, phosphate, sulfate, or silane based materials. In some embodiments, SAM further includes a tail group which is connected to the head group and which contains an organic chain, such as CHx or the like. The patterned blocking layer 130 may have a thickness ranging from 2 Å to 100 Å.

The method 300 then proceeds to block 320 where a protection layer is selectively formed on the dielectric protruding features. Referring to the example illustrated in FIG. 32, a dielectric material having superior etching selectivity is deposited on the dielectric protruding features 901 by a suitable deposition method as is known to those skilled in the art of semiconductor fabrication, such as CVD, PVD, ALD, spin-on deposition, electroless plating, etc., or combinations thereof to form a protection layer 113 covering the dielectric protruding features 901. The protection layer 113 may have a thickness ranging from 2 Å to 200 Å. The dielectric material for forming the protection layer 113 includes oxides, nitrides, or carbides of Al, zirconium (Zr), yttrium (Y), hafnium (Hf), or Ti, or mixtures or composites thereof, but not limited thereof.

The method 300 then proceeds to block 322 where the blocking layer is removed. Referring to the example illustrated in FIG. 33, the blocking layer 111 is removed from the electrically conductive features 307 by a heating, plasma, or wet chemical treatment. Specifically, the tail group of the blocking layer 130 is removed after the heating, plasma, or wet chemical treatment, and the head group of the SAM material remains on the electrically conductive features 307 to form a stable phase as a capping layer covering the electrically conductive features 307.

The method 300 then proceeds to block 324 where a first etch stop layer is deposited. Referring to the example illustrated in FIG. 34, a first etch stop layer 103 is deposited by a suitable deposition method as is known to those skilled in the art of semiconductor fabrication, such as PVD, CVD, ALD, PECVD, PEALD, etc., or combinations thereof to cover the protection layer 113 and the electrically conductive features 307. The first etch stop layer 103 is thermally conductive and may have a thickness ranging from 2 Å to 200 Å. The first etch stop layer 103 is made of a thermally conductive dielectric material which includes aluminum nitride, boron nitride (for example, h-BN), graphene oxide, diamond, silicon carbide, silicon carbonitride, or combinations thereof, but is not limited thereto.

The method 300 then proceeds to block 326 where a second etch stop layer is deposited. Referring to the example illustrated in FIG. 35, a second etch stop layer 105 is deposited on the first etch stop layer 103 by a suitable deposition method as is known to those skilled in the art of semiconductor fabrication, such as PVD, CVD, ALD, PECVD, PEALD, etc., or combinations thereof to form an etch stop layered structure including the first and second etch stop layers 103, 105. The second etch stop layer 105 may have a thickness ranging from 2 Å to 200 Å. The first etch stop layer 103 has a thermal conductivity higher than that of second etch stop layer 105. The second etch stop layer 105 may be made of aluminum compounds (for example, aluminum nitride, aluminum oxynitride, aluminum oxide, etc.), silicon compounds (for example, silicon oxide, silicon oxycarbide, silicon oxynitride, silicon carbonitride, silicon oxycarbonitride (SiCON), etc.), or combinations thereof, but are not limited thereto.

The method 300 then proceeds to block 328 where a patterned dielectric layer is formed on the second etch stop layer. Referring to the example illustrated in FIG. 36, a low-k dielectric layer is deposited on the second etch stop layer 105 by a suitable deposition method as is known to those skilled in the art of semiconductor fabrication, such as PVD, CVD, ALD, PECVD, PEALD, etc., or combinations thereof. Examples of a low-k dielectric material suitable for forming the low-k dielectric layer include silicon oxide, silicon nitride, silicon carbide, silicon oxycarbide, silicon oxynitride, silicon carbonitride, silicon oxycarbonitride, and combinations thereof, but are not limited thereto. The low-k dielectric layer is patterned by an etching process through a pattern opening of a patterned mask layer (now shown) to form a patterned dielectric layer 107 having a through hole 1071.

The method 300 then proceeds to block 330 where parts of the first and second etch stop layers are removed. Referring to the example illustrated in FIG. 36, the second etch stop layer 105 and the first etch stop layer 103 are further patterned by one or more etching processes to remove parts of the first and second etch stop layers 103, 105 exposed from the through hole 1071 so as to expose a corresponding one of the electrically conductive features 307 from the through hole 1071 while the dielectric protruding features 901 are covered by the protection layer 113.

The method 300 then proceeds to block 332 where an electrically conductive interconnect is formed in the through hole. Referring to the example illustrated in FIG. 37, an electrically conductive material is filled into the through hole 1071 to form an electrically conductive interconnect 109 electrically connected to the corresponding one of the electrically conductive features 307, respectively. Details regarding the formation of the electrically conductive interconnect 109 are the same as or similar to those described above with reference to FIG. 17.

Figure 37:
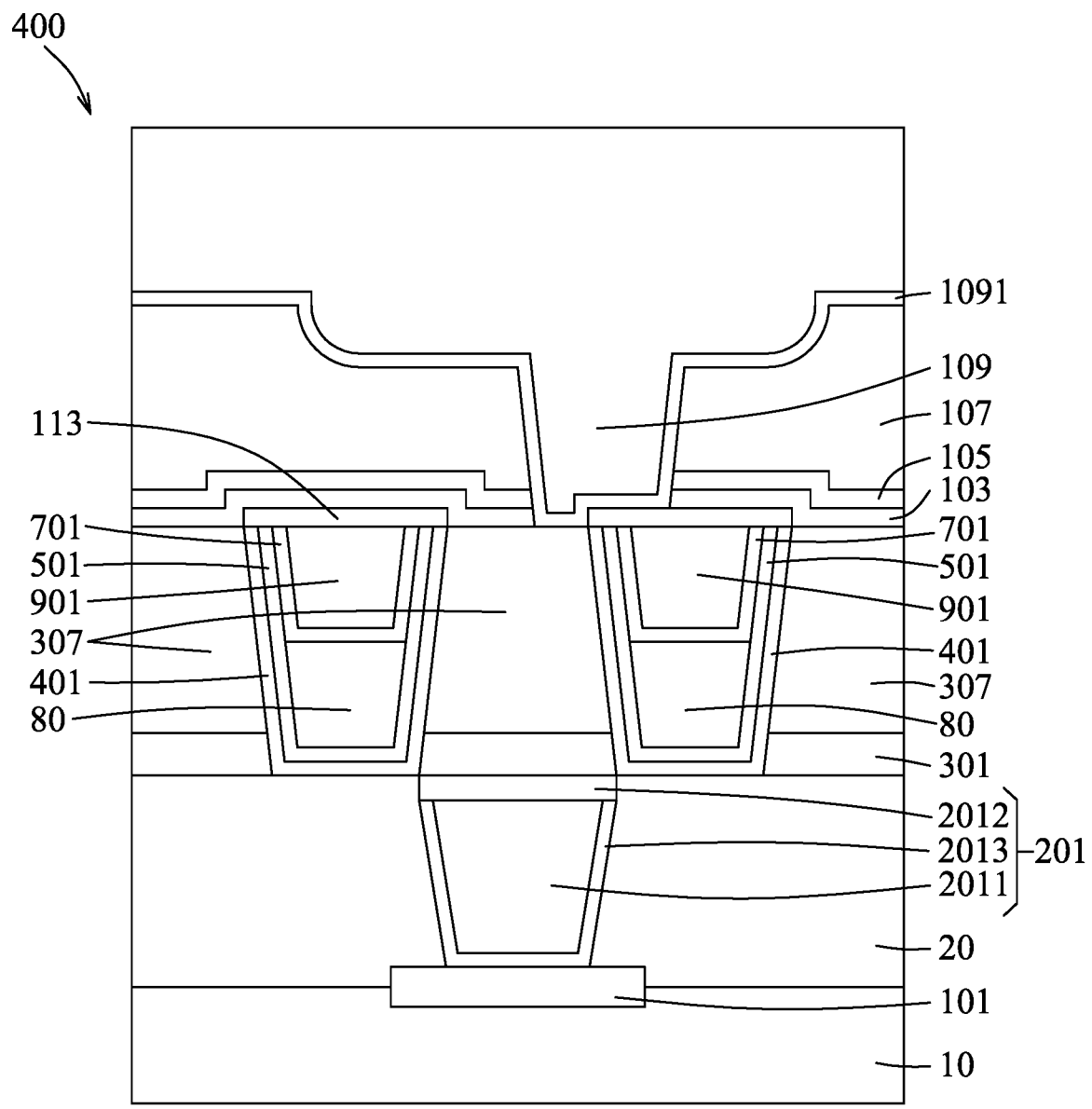
Figure 38:
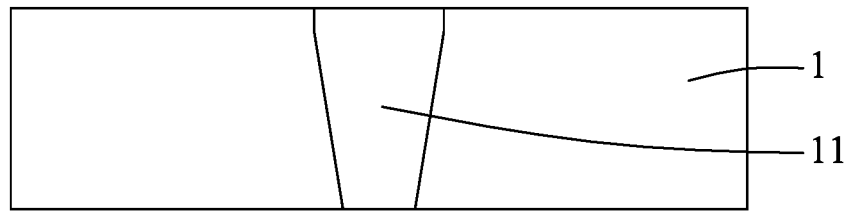
FIGS. 38 to 48 illustrate schematic views showing intermediate stages of a method for manufacturing a semiconductor device in accordance with some embodiments.
Figure 39:
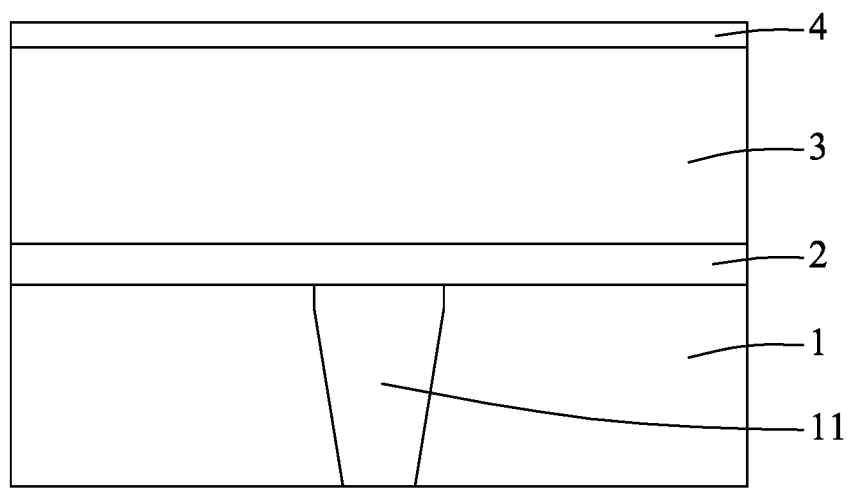
Figure 40:
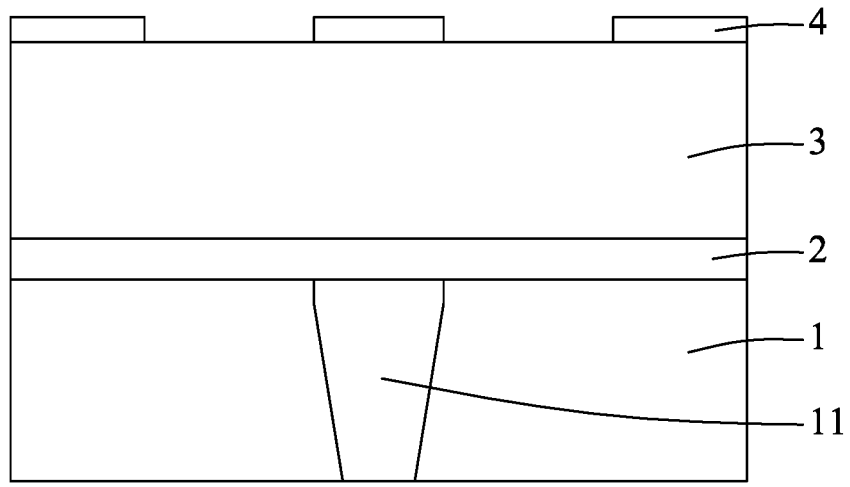
Figure 41:
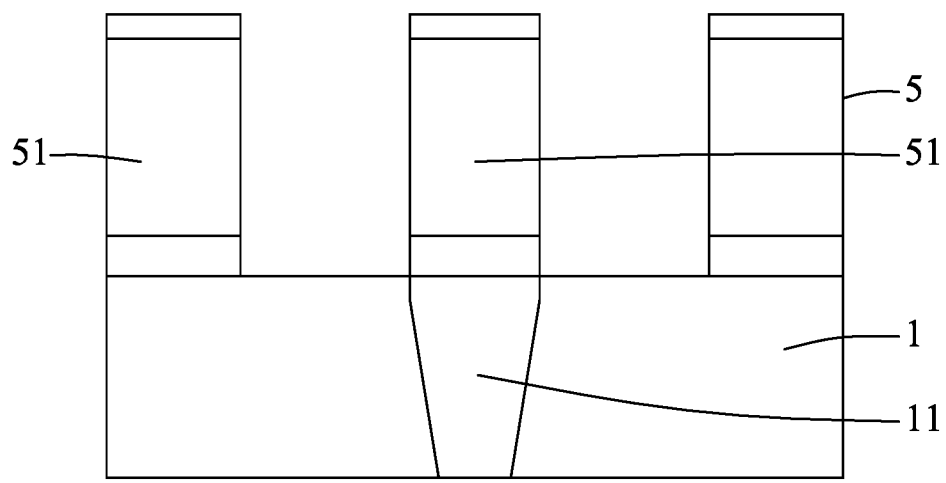
Figure 42:
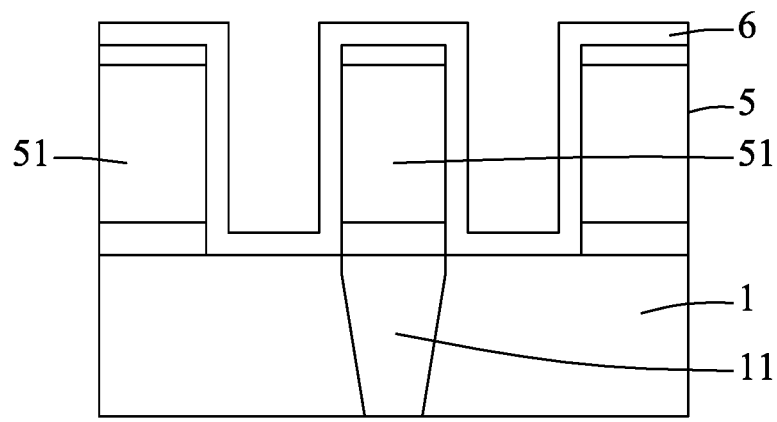
Figure 43:
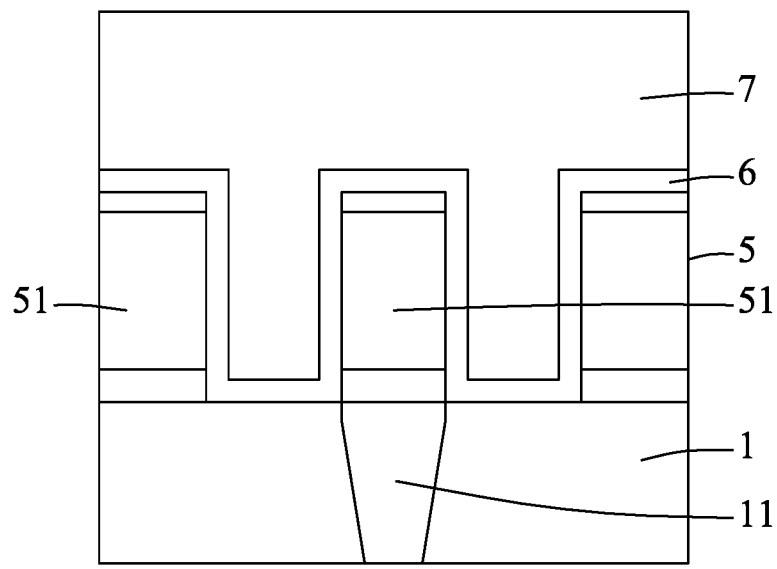
Figure 44:
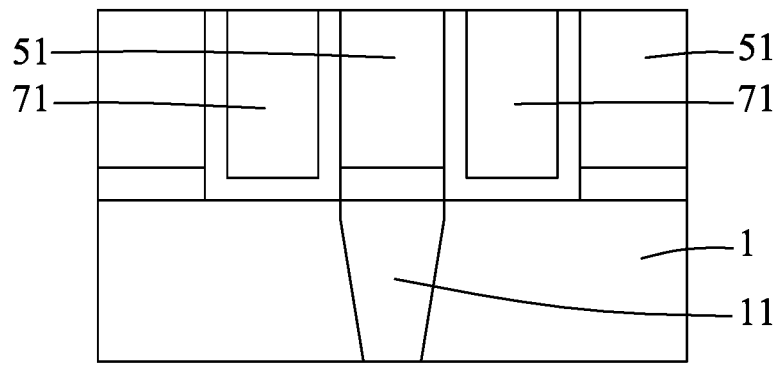
Figure 45:
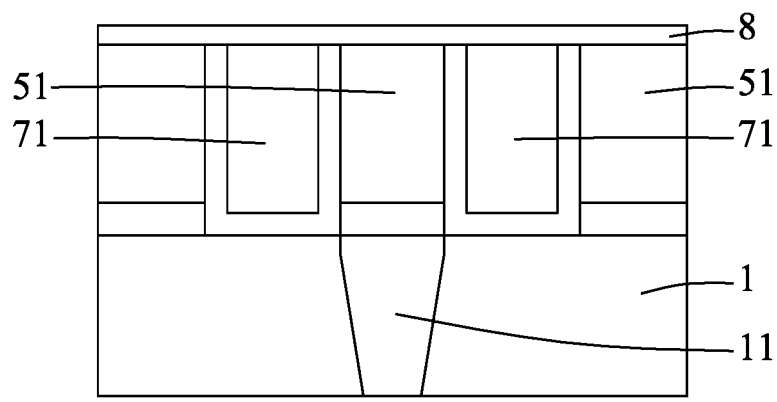
Figure 46:
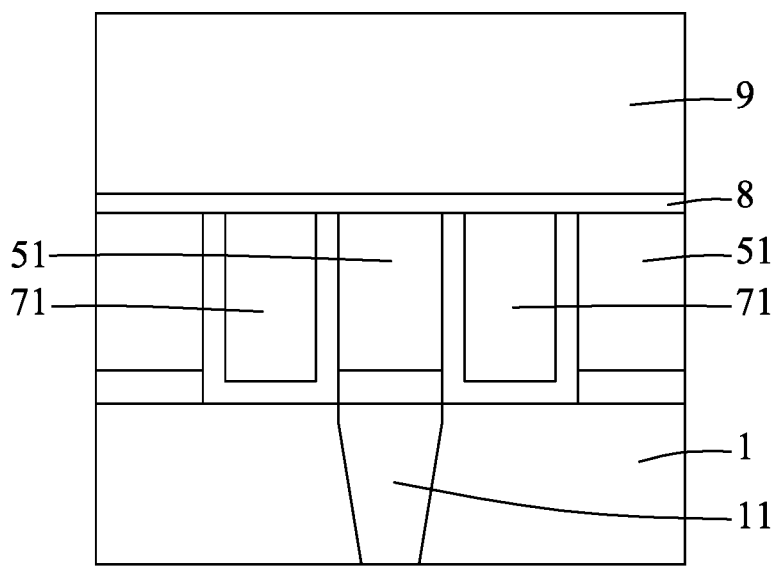
Figure 47:
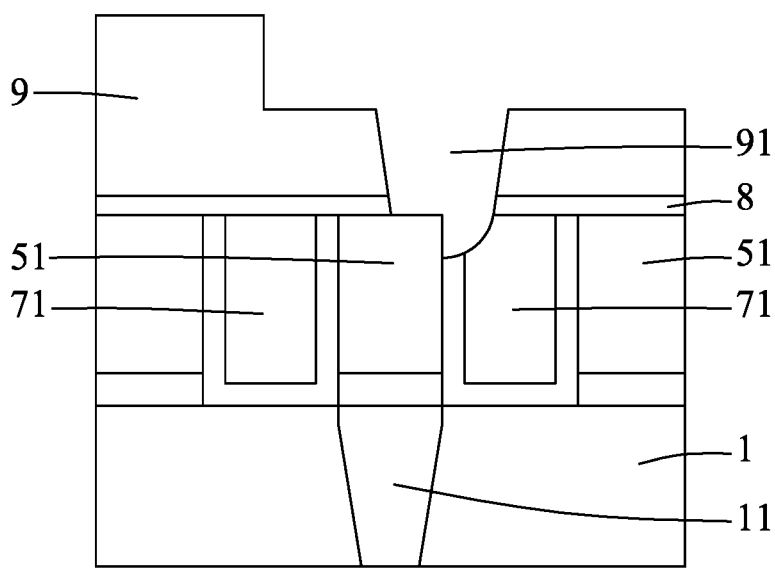
Figure 48:
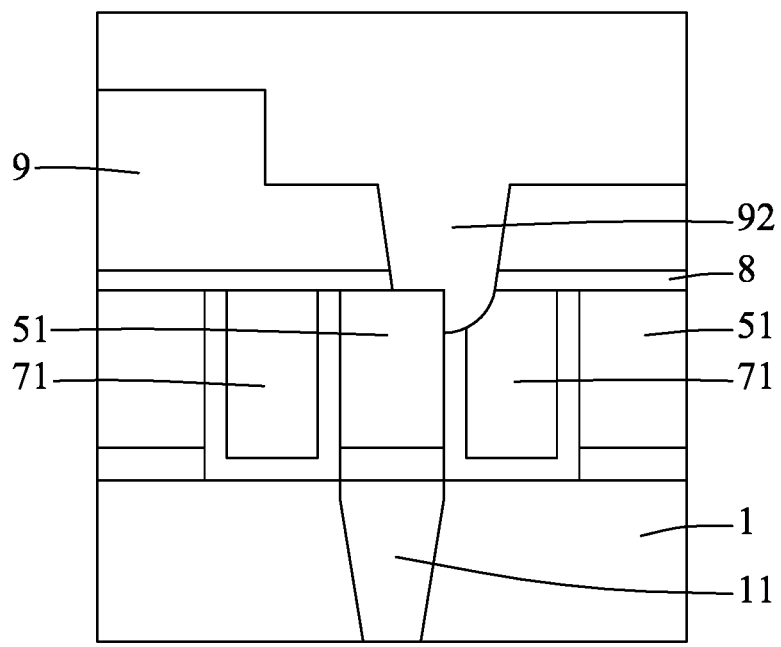

Referring to the example illustrated in FIG. 37, in addition to the advantages of the semiconductor structure 200 described above in reference with FIG. 17, in the semiconductor structure 400, the dielectric protruding features 901 are covered by the protection layer 113 which is made of a dielectric material having superior etching selectivity. The dielectric protruding features 901 will not be damaged during formation of the through hole 1071 of the patterned dielectric layer 107. The reliability issues, such as degradation of time dependent dielectric breakdown (TDDB) and metal leakage can be prevented after the electrically conductive interconnect 109 is formed in the through hole 1071.

Referring to FIGS. 38 to 48, in a method for manufacturing a semiconductor device in accordance with some embodiments, a dielectric layer 1 (for example, a dielectric silicon oxide layer) formed with at least one first electrically conductive element 11 (for example, an electrically conductive via contact) is prepared. A glue layer 2, a metal layer 3, and a mask layer 4 (for example, a hard mask layer) are deposited sequentially on the dielectric layer 1. The mask layer 4 is patterned using photolithography and photoresist developing technology as is known to those skilled in the art of semiconductor fabrication. A pattern formed in the patterned mask layer 4 is then transferred to the metal layer 3 and the glue layer 2 by one or more etching processes to form an electrically conductive structure 5 including a plurality of electrically conductive features 51 (for example, electrically conductive metal lines). A dielectric capping layer 6 is conformally deposited on the electrically conductive structure 5. A first low-k dielectric material is then filled into the gaps defined by the dielectric capping layer 6 and is further deposited on the dielectric capping layer 6 to form a first low-k dielectric layer 7. Chemical mechanical planarization (CMP) is then implemented to obtain a semiconductor device, which includes the electrically conductive features 51 and a plurality of low-k dielectric spacers 71 to isolate the electrically conductive features 51 from each other. The semiconductor device has a substantially flat top surface with the top surfaces of the electrically conductive features 51 being horizontally flush with those of the low-k dielectric spacers 71. An etch stop layer 8 and a second low-k dielectric layer 9 are deposited sequentially on the substantially flat top surface of the semiconductor device, and are then subjected to one or more etching processes through a patterned hard mask (now shown) to form at least one hole 91 which permits at least one of the electrically conductive features 51 to be exposed, respectively. An electrically conductive material is filled into the at least one hole 91 to form at least one second electrically conductive element 92 (for example, an electrically conductive via contact) in contact with the at least one of the electrically conductive features 51, respectively.

By using the sacrificial material to form the sacrificial features 601, formation of the air gaps 80 in the semiconductor device 200, 400 can be well controlled. In addition, the air gaps 80 are formed among the electrically conductive features 307, and the second dielectric spacer layers 501 formed from the low-k dielectric material laterally cover the electrically conductive features 307. The semiconductor device 200, 400 thus manufactured can provide a relatively low capacitance. Furthermore, the electrically conductive features 307 are covered by the first dielectric spacer layers 401 and the first etch stop layer 103, both of which are made of a dielectric material having a relatively high thermal conductivity, so the semiconductor device 200, 400 can have good electromigration resistance. Moreover, the dielectric protruding features 901 are covered by the protection layer 113 which is made of a dielectric material having superior etching selectivity. The dielectric protruding features 901 will not be damaged during formation of the through hole 1071 of the patterned dielectric layer 107. The reliability issues, such as degradation of time dependent dielectric breakdown (TDDB) and metal leakage can be prevented after the electrically conductive interconnect 109 is formed in the through hole 1071.

In accordance with some embodiments of the present disclosure, a method for manufacturing a semiconductor device includes preparing an electrically conductive structure including a plurality of electrically conductive features, adjacent two of which are spaced apart from each other by a corresponding one of recesses; conformally forming a thermally conductive dielectric capping layer on the electrically conductive structure; conformally forming a dielectric coating layer on the thermally conductive dielectric capping layer; filling a sacrificial material into the recesses; recessing the sacrificial material to form sacrificial features in the recesses; forming a sustaining layer over the dielectric coating layer to cover the sacrificial features; and removing the sacrificial features to form air gaps covered by the sustaining layer. The thermally conductive dielectric capping layer has a thermal conductivity higher than that of the dielectric coating layer.

In accordance with some embodiments of the present disclosure, a semiconductor device includes an electrically conductive structure, a spacer structure, and an interconnect layer. The electrically conductive structure includes a first electrically conductive feature and a second electrically conductive feature. The spacer structure is configured to space the first and second electrically conductive features apart from each other, and includes a first dielectric spacer layer, a second dielectric spacer layer, and a sustaining cap. The first dielectric spacer layer contacts lateral surfaces of the first and second electrically conductive features. The second dielectric spacer layer conformally covers the first dielectric spacer layer. The first dielectric spacer layer has a thermal conductivity higher than that of the second dielectric spacer layer. The sustaining cap is formed on the second dielectric spacer layer and cooperates with the second dielectric spacer layer to define an air gap disposed between the first and second electrically conductive features. The interconnect layer has an electrically conductive interconnect electrically connected to one of the first and second electrically conductive features.

In accordance with some embodiments of the present disclosure, a semiconductor device includes an electrically conductive feature, a first spacer structure, a second spacer structure, and an interconnect layer. The first spacer structure and the second spacer structure are spaced apart from each other by the electrically conductive feature. Each of the first and second spacer structures includes a first dielectric spacer layer, a second dielectric spacer layer, and a sustaining cap. The first dielectric spacer layer is formed into a caved shape. A part of the first dielectric spacer contacts a lateral surface of the electrically conductive feature. The second dielectric spacer layer conformally covers the first dielectric spacer layer. The first dielectric spacer layer has a thermal conductivity higher than that of the second dielectric spacer layer. The sustaining cap is formed on the second dielectric spacer and cooperates with the second dielectric spacer layer to define an air gap therebetween. The interconnect layer has an electrically conductive interconnect electrically connected to the electrically conductive feature.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an electrically conductive structure including a first electrically conductive feature and a second electrically conductive feature;
   a spacer structure configured to space the first electrically conductive feature and the second electrically conductive feature apart from each other, and including
      a first dielectric spacer layer contacting lateral surfaces of the first electrically conductive feature and the second electrically conductive feature,
      a second dielectric spacer layer conformally covering the first dielectric spacer layer, the first dielectric spacer layer having a thermal conductivity higher than a thermal conductivity of the second dielectric spacer layer, and
      a sustaining cap formed on the second dielectric spacer layer and cooperating with the second dielectric spacer layer to define an air gap disposed between the first electrically conductive feature and the second electrically conductive feature; and
   an interconnect layer having a conductive interconnect structure connected to one of the first electrically conductive feature and the second electrically conductive feature,
   wherein
   the first dielectric spacer layer includes graphene oxide, diamond, or a combination thereof,
   the second dielectric spacer layer includes aluminum nitride, aluminum oxynitride, aluminum oxide, silicon oxide, silicon oxynitride, silicon oxycarbonitride, or combinations thereof, and
   the conductive interconnect structure is in direct contact with the spacer structure.

2. The semiconductor device according to claim 1, further comprising an etch stop layered structure which is disposed on and in direct contact with the spacer structure and the electrically conductive structure and which exposes the one of the first electrically conductive feature and the second electrically conductive feature.

3. The semiconductor device according to claim 2, further comprising a protruding feature disposed below the etch stop layered structure and isolated from the air gap by the sustaining cap, wherein the protruding feature is in direct contact with the etch stop layered structure.

4. The semiconductor device according to claim 3, wherein the protruding feature is conformally covered by the sustaining cap.

5. The semiconductor device according to claim 3, wherein the conductive interconnect structure is in direct contact with the protruding feature.

6. The semiconductor device according to claim 2, wherein the etch stop layered structure includes a first etch stop layer disposed on and in direct contact with the spacer structure and the electrically conductive structure, and a second etch stop layer disposed on the first etch stop layer, the first etch stop layer having a thermal conductivity higher than a thermal conductivity of the second etch stop layer.

7. The semiconductor device according to claim 6, wherein the first etch stop layer includes aluminum nitride, boron nitride, graphene oxide, diamond, silicon carbide, silicon carbonitride, or combinations thereof.

8. The semiconductor device according to claim 6, wherein the conductive interconnect structure is in direct contact with the first etch stop layer and the second etch stop layer.

9. The semiconductor device according to claim 1, wherein the conductive interconnect structure incudes a barrier layer and an electrically connective interconnect disposed on the barrier layer, and the barrier layer is in direct contact with the spacer structure.

10. The semiconductor device according to claim 9, wherein the barrier layer extends into the electrically conductive structure and the spacer structure.

11. The semiconductor device according to claim 1, wherein the air gap has a top surface lower than a top surface of each of the first electrically conductive feature and the second electrically conductive feature.

12. The semiconductor device according to claim 1, wherein the conductive interconnect structure extends into the spacer structure and one of the first electrically conductive feature and the second electrically conductive feature.

13. The semiconductor device according to claim 1, further comprising a glue layer spaced apart from the second dielectric spacer layer by the first dielectric spacer layer.

14. A semiconductor device, comprising:
   an electrically conductive feature;
   a first spacer structure and a second spacer structure spaced apart from each other by the electrically conductive feature, each of the first spacer structure and the second spacer structure including
      a first dielectric spacer layer with a caved shape, a part of the first dielectric spacer layer contacting a lateral surface of the electrically conductive feature,
      a second dielectric spacer layer conformally covering the first dielectric spacer layer, the first dielectric spacer layer having a thermal conductivity higher than a thermal conductivity of the second dielectric spacer layer, and
      a sustaining cap disposed on the second dielectric spacer layer and cooperating with the second dielectric spacer layer to define an air gap between the sustaining cap and the second dielectric spacer layer;
   an etch stop layered structure which exposes the electrically conductive feature and which includes a first etch stop layer disposed on and in direct contact with the first spacer structure, the second spacer structure and the electrically conductive feature, and a second etch stop layer disposed on the first etch stop layer, the first etch stop layer having a thermal conductivity higher than a thermal conductivity of the second etch stop layer; and an interconnect layer having a conductive interconnect structure connected to the electrically conductive feature, wherein the first dielectric spacer layer includes graphene oxide, diamond, or a combination thereof, the second dielectric spacer layer includes aluminum nitride, aluminum oxynitride, aluminum oxide, silicon oxide, silicon oxynitride, silicon oxycarbonitride, or combinations thereof, and the conductive interconnect structure is in direct contact with the first dielectric spacer layer, the second dielectric spacer layer, and the sustaining cap.

15. The semiconductor device according to claim 14, wherein each of the first spacer structure and the second spacer structure further includes a protruding feature disposed below the etch stop layered structure and isolated from the air gap by the sustaining cap, and the conductive interconnect structure is further in direct contact with the protruding feature.

16. The semiconductor device according to claim 14, wherein the conductive interconnect structure incudes a barrier layer and an electrically connective interconnect disposed on the barrier layer, and the barrier layer is in direct contact with the first dielectric spacer layer, the second dielectric spacer layer, and the sustaining cap.

17. The semiconductor device according to claim 16, wherein each of the first spacer structure and the second spacer structure further includes a protruding feature disposed below the etch stop layered structure and isolated from the air gap by the sustaining cap, and the barrier layer is further in direct contact with the protruding feature.

18. A semiconductor device, comprising:

an electrically conductive structure including a first electrically conductive feature and a second electrically conductive feature;

a spacer structure configured to space the first electrically conductive feature and the second electrically conductive feature apart from each other, and including a first dielectric spacer layer contacting lateral surfaces of the first electrically conductive feature and the second electrically conductive feature, a second dielectric spacer layer conformally covering the first dielectric spacer layer, the first dielectric spacer layer having a thermal conductivity higher than a thermal conductivity of the second dielectric spacer layer, and a sustaining cap including a bottom portion cooperating with the second dielectric spacer layer to define an air gap, and a wall portion extending upwardly from the bottom portion and connected to the second dielectric spacer layer;

an etch stop layered structure which includes a first etch stop layer disposed on and covering the spacer structure and the electrically conductive structure, and a second etch stop layer disposed on the first etch stop layer, the first etch stop layer having a thermal conductivity higher than a thermal conductivity of the second etch stop layer; and an interconnect layer having a conductive interconnect structure connected to one of the first electrically conductive feature and the second electrically conductive feature, wherein the first etch stop layer includes boron nitride, graphene oxide, diamond, or combinations thereof, the second etch stop layer includes aluminum nitride, aluminum oxynitride, aluminum oxide, silicon oxycarbide, silicon oxynitride, silicon carbonitride, silicon oxycarbonitride, or combinations thereof, and the conductive interconnect structure incudes a barrier layer and an electrically connective interconnect disposed on the barrier layer, and the barrier layer extends into the electrically conductive structure and the spacer structure.

19. The semiconductor device according to claim 18, further comprising a protruding feature disposed on the bottom portion of the sustaining cap opposite to the air gap and laterally covered by the wall portion of the sustaining cap.

20. The semiconductor device according to claim 19, wherein the first etch stop layer is disposed on and in direct contact with the protruding feature; and the second etch stop layer is disposed on the first etch stop layer opposite to the protruding feature.

* * * * *